US011319452B2

(12) United States Patent
Gordon

(10) Patent No.: US 11,319,452 B2
(45) Date of Patent: May 3, 2022

(54) VAPOR SOURCE USING SOLUTIONS OF PRECURSORS IN TERTIARY AMINES

(71) Applicant: President and Fellows of Harvard College, Cambridge, MA (US)

(72) Inventor: Roy Gerald Gordon, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 14/895,373

(22) PCT Filed: Jun. 6, 2014

(86) PCT No.: PCT/US2014/041310
§ 371 (c)(1),
(2) Date: Dec. 2, 2015

(87) PCT Pub. No.: WO2014/197801
PCT Pub. Date: Dec. 11, 2014

(65) Prior Publication Data
US 2016/0115328 A1 Apr. 28, 2016

Related U.S. Application Data

(60) Provisional application No. 61/831,784, filed on Jun. 6, 2013.

(51) Int. Cl.
| C09D 7/00 | (2018.01) |
| C09D 7/63 | (2018.01) |
| C23C 16/18 | (2006.01) |
| C23C 16/34 | (2006.01) |
| C07F 5/00 | (2006.01) |
| C07F 13/00 | (2006.01) |
| C07F 15/00 | (2006.01) |
| C07F 1/00 | (2006.01) |
| C07F 15/04 | (2006.01) |
| C07F 19/00 | (2006.01) |
| C07F 15/06 | (2006.01) |
| C07F 7/22 | (2006.01) |
| C08K 5/56 | (2006.01) |
| C23C 16/448 | (2006.01) |

(52) U.S. Cl.
CPC .............. *C09D 7/63* (2018.01); *C07F 1/005* (2013.01); *C07F 5/003* (2013.01); *C07F 7/2284* (2013.01); *C07F 13/005* (2013.01); *C07F 15/0046* (2013.01); *C07F 15/045* (2013.01); *C07F 15/065* (2013.01); *C07F 19/005* (2013.01); *C08K 5/56* (2013.01); *C23C 16/18* (2013.01); *C23C 16/34* (2013.01); *C23C 16/4481* (2013.01)

(58) Field of Classification Search
None
See application file for complete search history.

(56) References Cited

U.S. PATENT DOCUMENTS

| 5,139,999 A | 8/1992 | Gordon et al. |
| 6,180,190 B1 | 1/2001 | Gordon |
| 7,557,229 B2 | 7/2009 | Gordon et al. |
| 7,737,290 B2 | 6/2010 | Gordon et al. |
| 2008/0160204 A1* | 7/2008 | Lavoie ................ C23C 18/38 427/431 |
| 2009/0017208 A1* | 1/2009 | Shenai-Khatkhate ................ C23C 16/45553 427/255.38 |
| 2009/0162550 A1* | 6/2009 | Chen .................... C07C 275/70 427/252 |

FOREIGN PATENT DOCUMENTS

| JP | 2003-522827 A | 7/2003 |
| WO | WO-00/29637 A1 | 5/2000 |
| WO | WO-2012/087794 A1 | 6/2012 |

OTHER PUBLICATIONS

Au et al., Vapor Deposition of Highly Conformal Copper Seed Layers for Plating Through-Silicon vias (TSVs), Journal of The Electrochemical Society, 159 (6) D382-D385 (2012).
International Search Report dated Sep. 18, 2014, in the International application PCT/US2014/41310, filed Jun. 6, 2014, 4 pages.
PubChem, "Tert-Butylamine". NIH National Library of Medicine, National Center for Biotechnology Information. First accessed, Jun. 7, 2021. 52 pages. (Available at: https://pubchem.ncbi.nlm.nih.gov/compound/tert-butylamine).
PubChem, "Triamylamine". NIH National Library of Medicine, National Center for Biotechnology Information. First accessed, Jun. 7, 2021. 30 pages. (Available at: https://pubchem.ncbi.nlm.nih.gov/compound/Triamylamine).
PubChem, "Tributylamine". NIH National Library of Medicine, National Center for Biotechnology Information. First accessed, Jun. 7, 2021. 48 pages. (Available at: https://pubchem.ncbi.nlm.nih.gov/compound/tributylamine).
PubChem, "Triethylamine". NIH National Library of Medicine, National Center for Biotechnology Information. First accessed, Jun. 7, 2021. 67 pages. (Available at: https://pubchem.ncbi.nlm.nih.gov/compound/Triethylamine).
PubChem, "Triheptylamine". NIH National Library of Medicine, National Center for Biotechnology Information. First accessed, Jun. 7, 2021. 19 pages. (Available at: https://pubchem.ncbi.nlm.nih.gov/compound/Triheptylamine).

(Continued)

*Primary Examiner* — Yun Qian
(74) *Attorney, Agent, or Firm* — Wilmer Cutler Pickering Hale and Dorr LLP

(57) ABSTRACT

This disclosure relates to tertiary amine solutions of metal precursors used for chemical vapor deposition or atomic layer deposition. The tertiary amine solutions have many advantages. They dissolve high concentrations of non-polar precursors without reacting with them. They do not supply impurities such as oxygen or halogens to the material being produced, nor do they etch or corrode them. Vaporization rates can be chosen so that the solute and solvent may be evaporated simultaneously, have high flash points, and low flammability. Small droplets may be formed easily which facilitate rapid evaporation without decomposition of he dissolved metal precursor to supply vapors for chemical vapor deposition or atomic layer deposition processes.

16 Claims, 16 Drawing Sheets

(56) References Cited

OTHER PUBLICATIONS

PubChem, "Trihexylamine". NIH National Library of Medicine, National Center for Biotechnology Information. First accessed, Jun. 7, 2021. 29 pages. (Available at: https://pubchem.ncbi.nlm.nih.gov/compound/Trihexylamine).
PubChem, "Trioctylamine". NIH National Library of Medicine, National Center for Biotechnology Information. First accessed, Jun. 7, 2021. 35 pages. (Available at: https://pubchem.ncbi.nlm.nih.gov/compound/Trioctylamine).

* cited by examiner

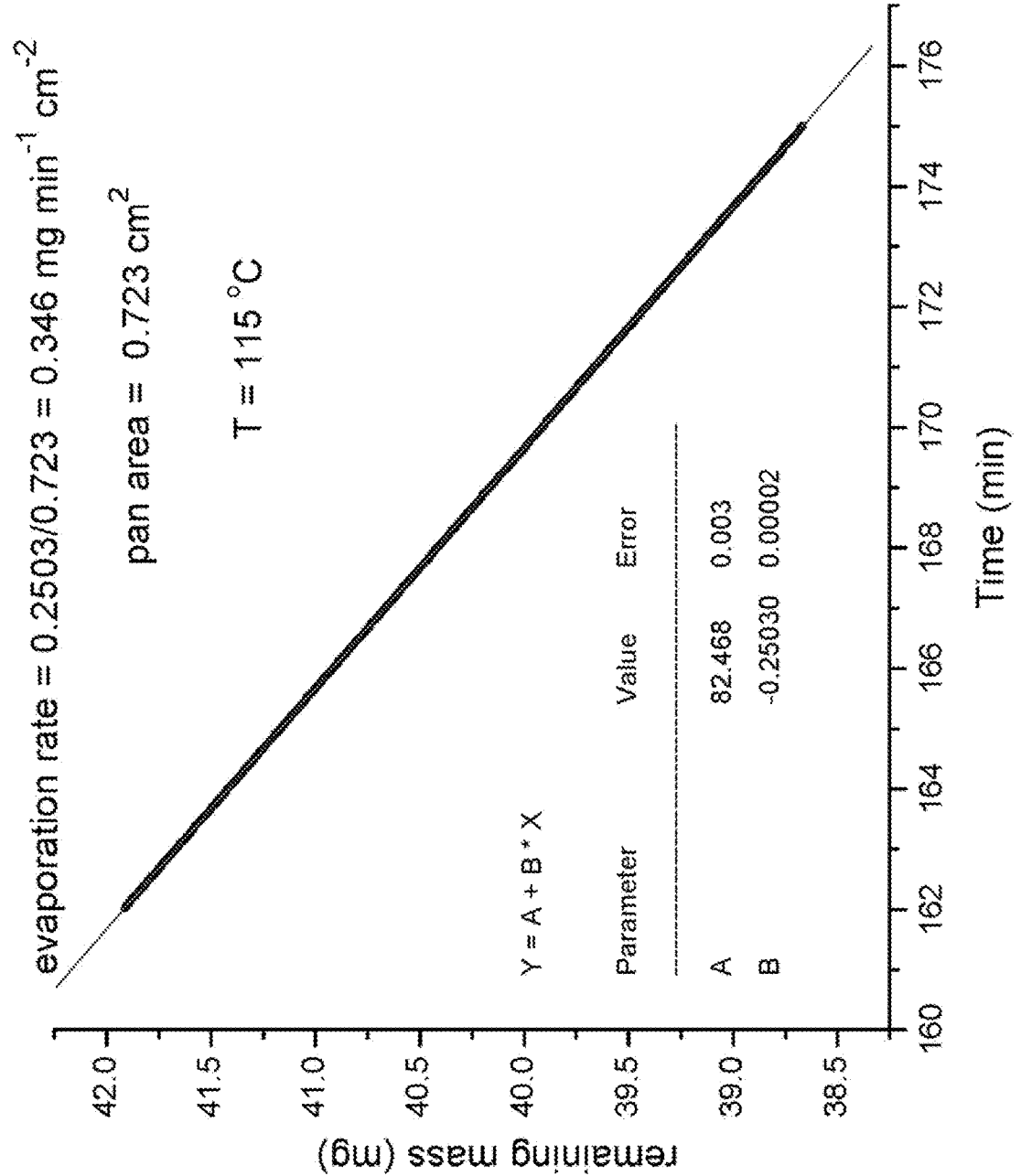
Fig. 1. Evaporation rate of trihexylamine at 115 °C

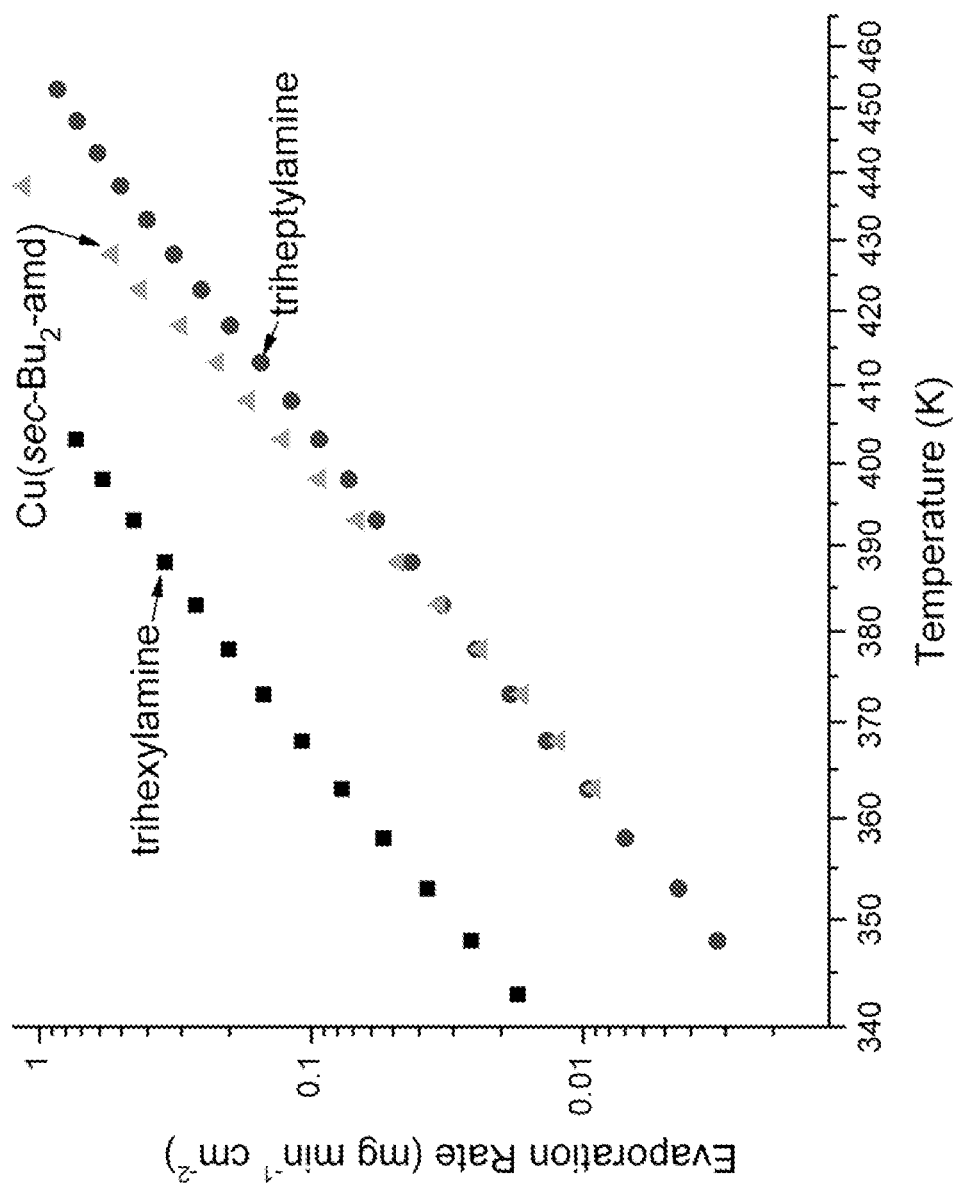
Fig. 2. Evaporation rates of (*N,N'*-di-*sec*-butylacetamidinato)copper(I) dimer and trialkylamines

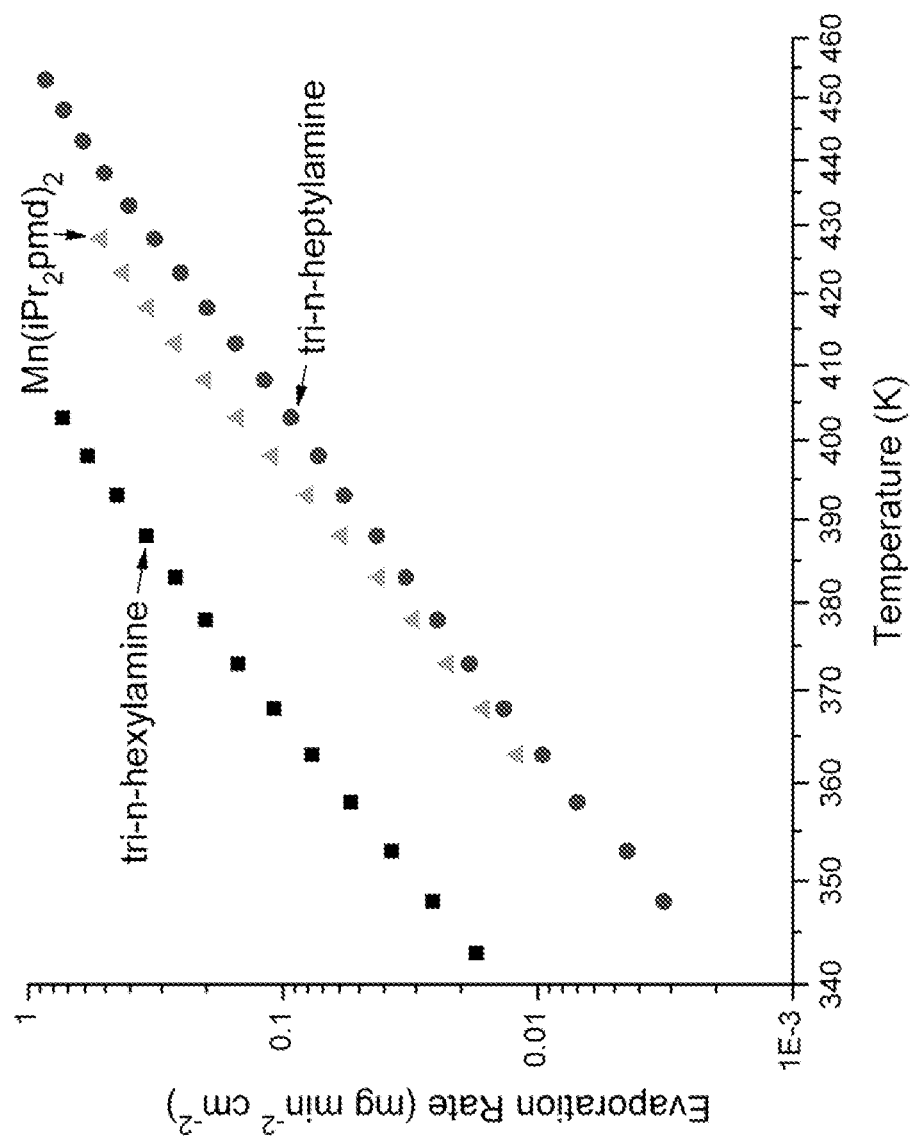
Fig. 3. Evaporation rates of bis(N,N'-diisopropylpentamidinato)manganese(II) and trialkylamines

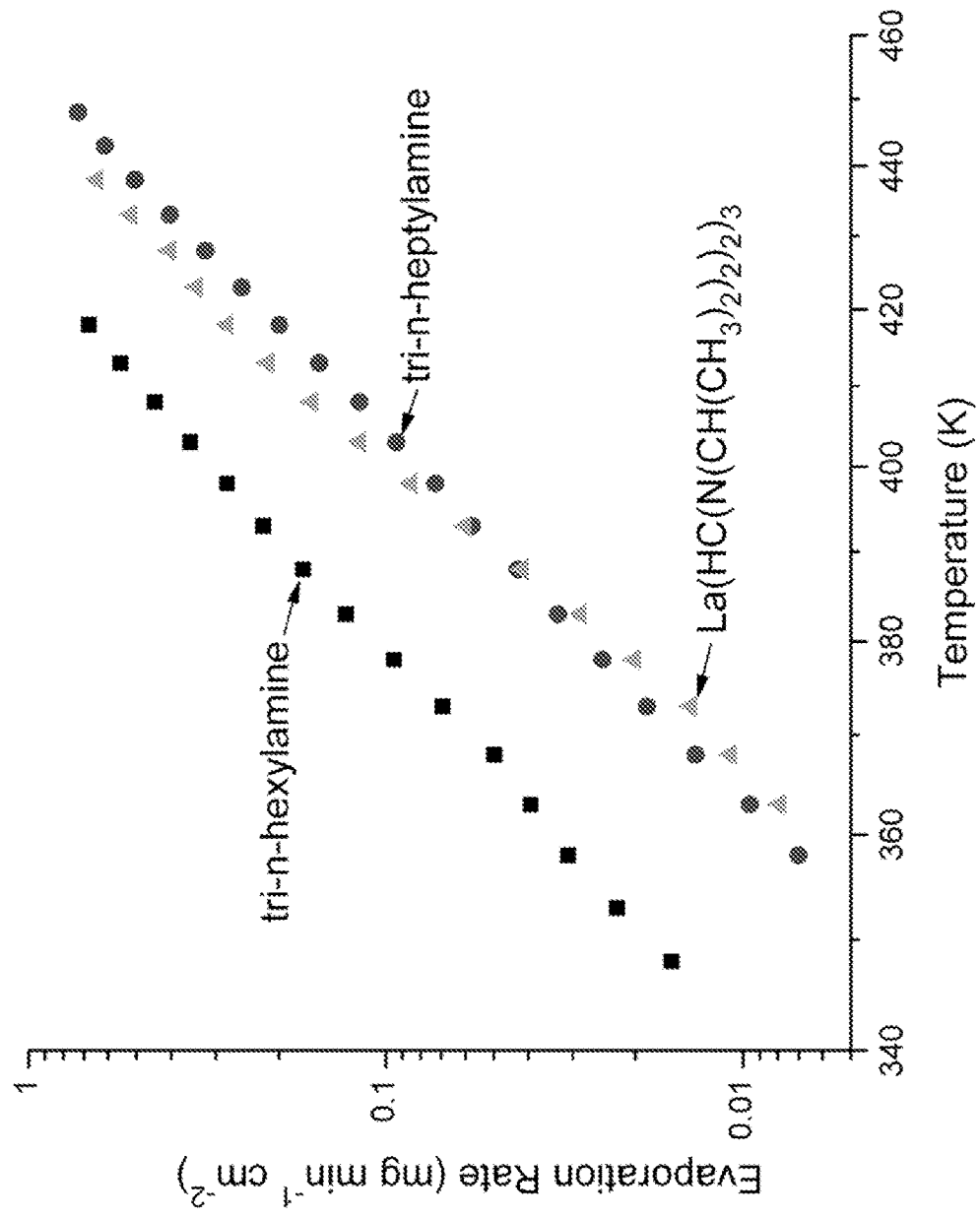
Fig. 4. Evaporation rates of tris(*N,N'*-diisopropylformamidinato)lanthanum(III) and trialkylamines

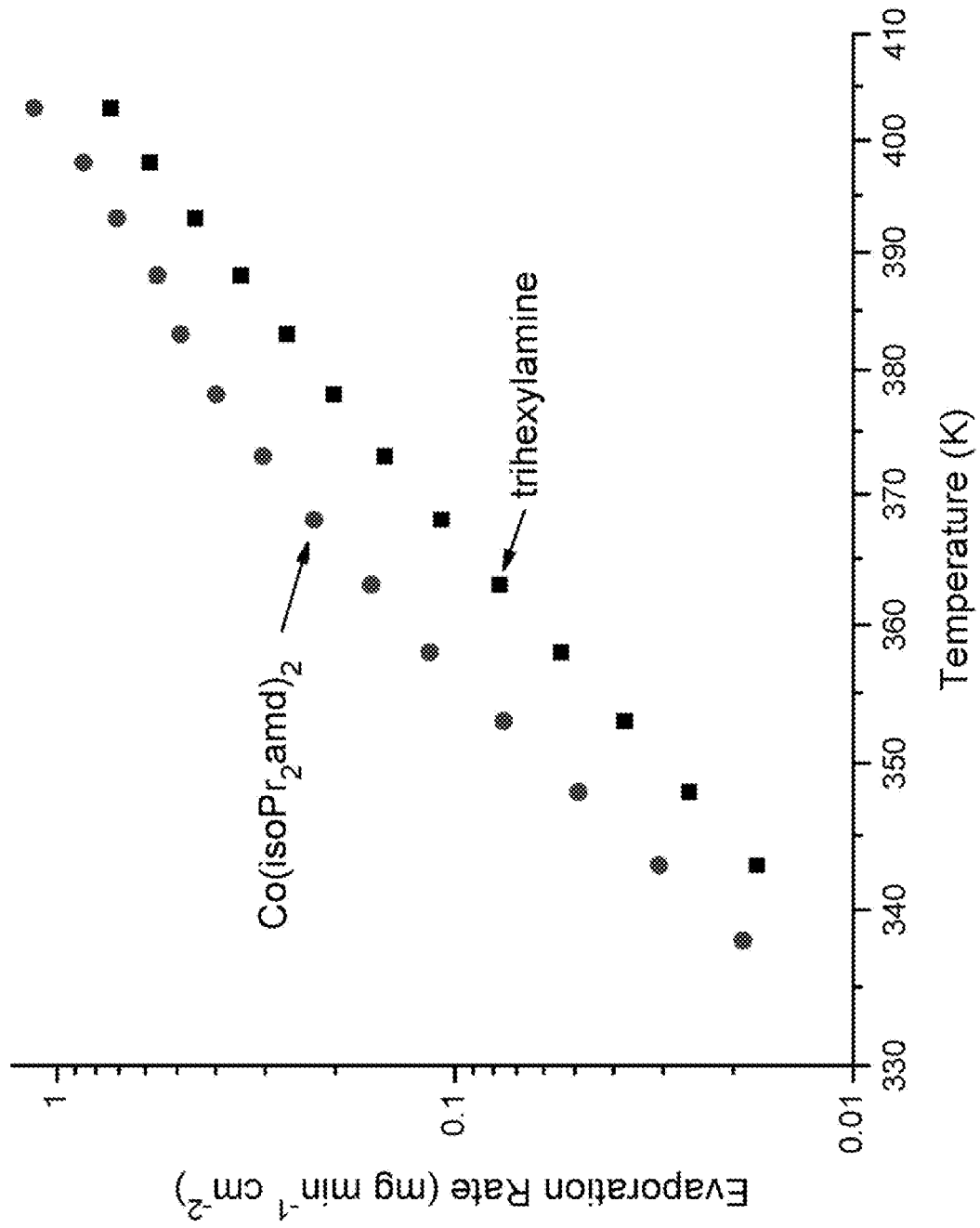
Fig. 5. Evaporation rates of bis(N,N'-diisopropylacetamidinato)cobalt(II) and tri-n-hexylamine

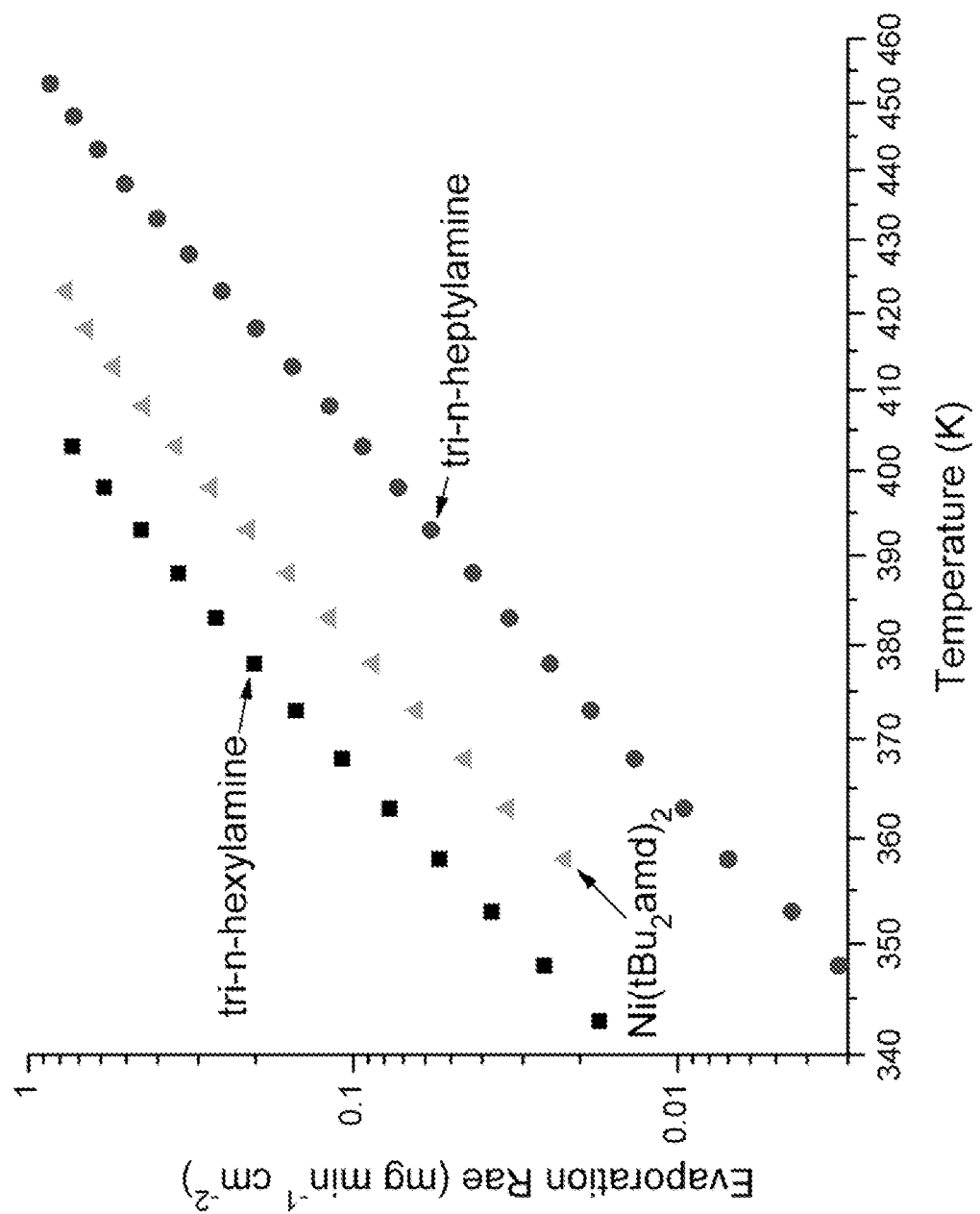
Fig. 6. Evaporation rates of bis(*N,N'*-di-*tert*-butylacetamidinato)nickel(II) and trialkylamines

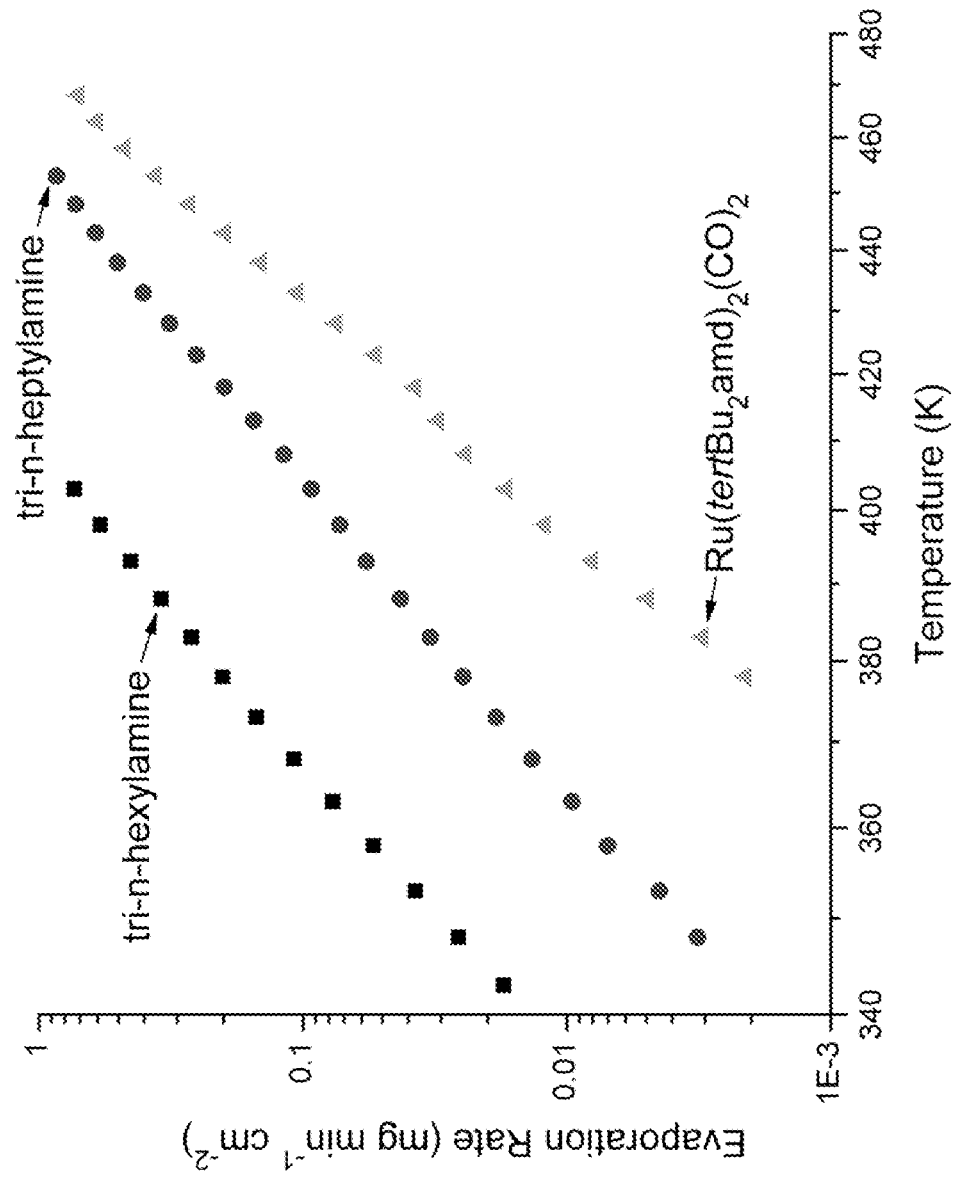
Fig. 7. Evaporation rates of bis(N,N'-di-tert-butylacetamidinato)ruthenium(II)dicarbonyl and trialkylamines

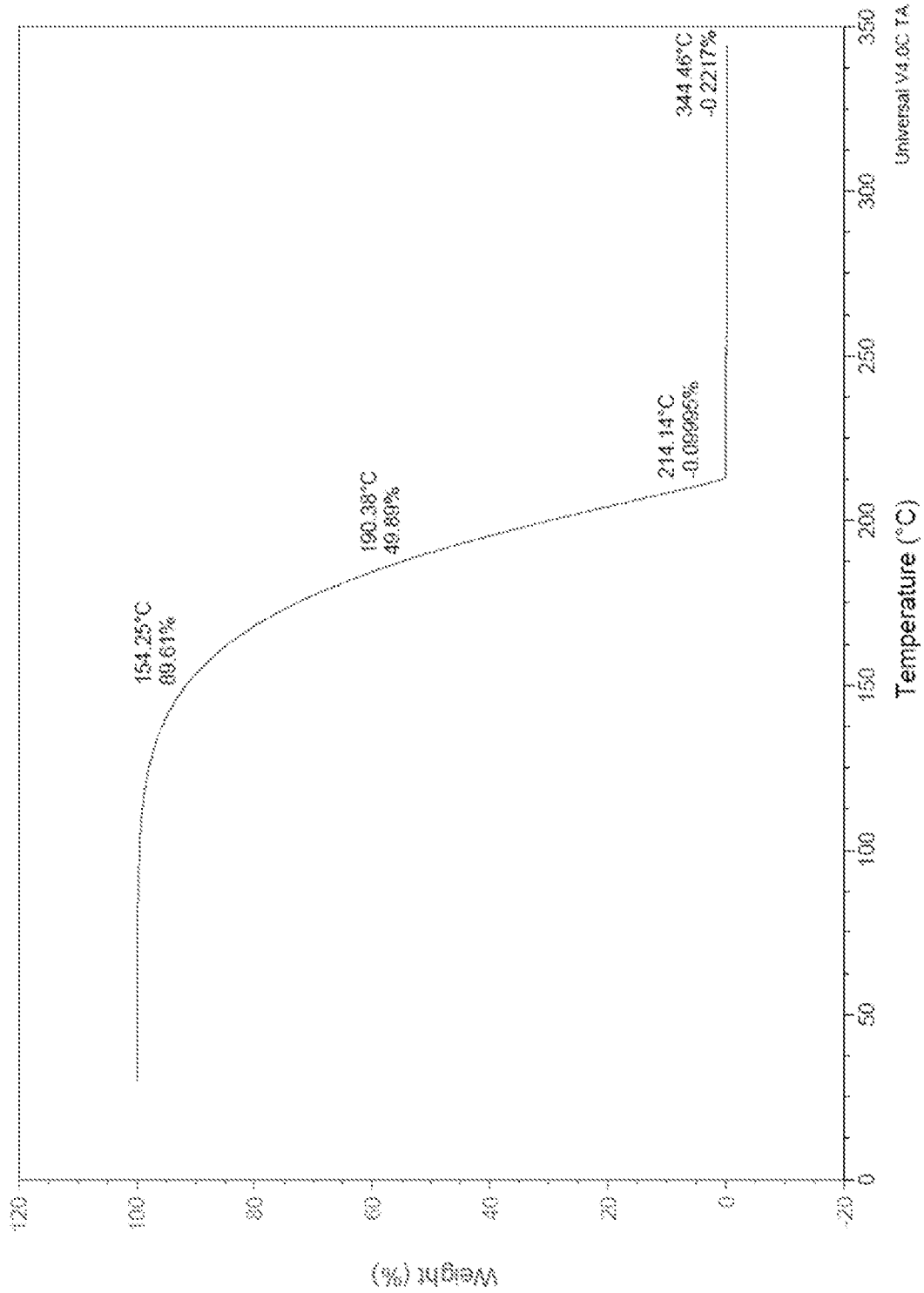
Fig. 8. Mass loss of tri-n-hexylamine as temperature is increased at 10 K min$^{-1}$

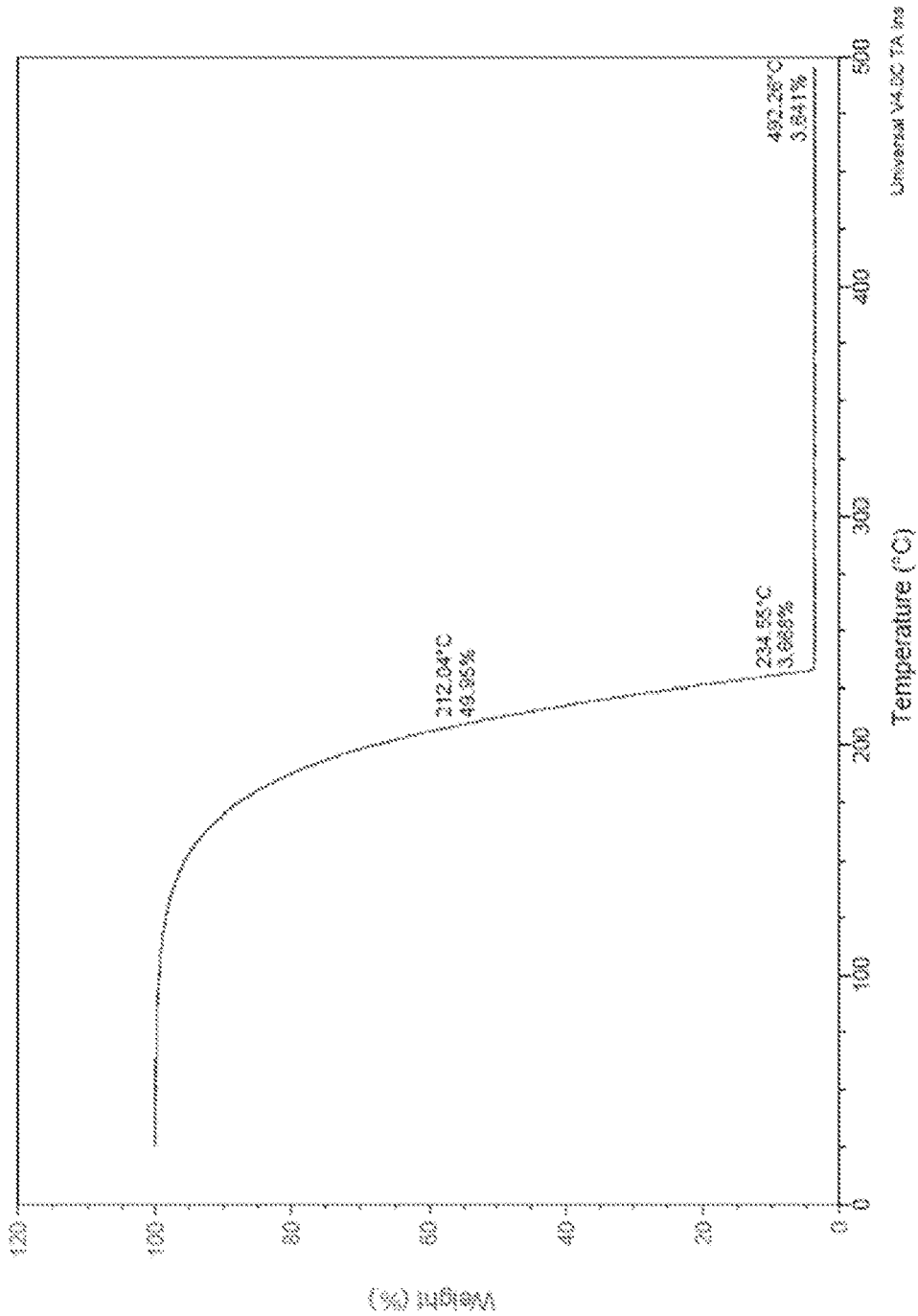
Fig. 9. Mass loss of (*N,N'*-di-*sec*-butylacetamidinato)copper(I) dimer as temperature is increased at 10 K min$^{-1}$

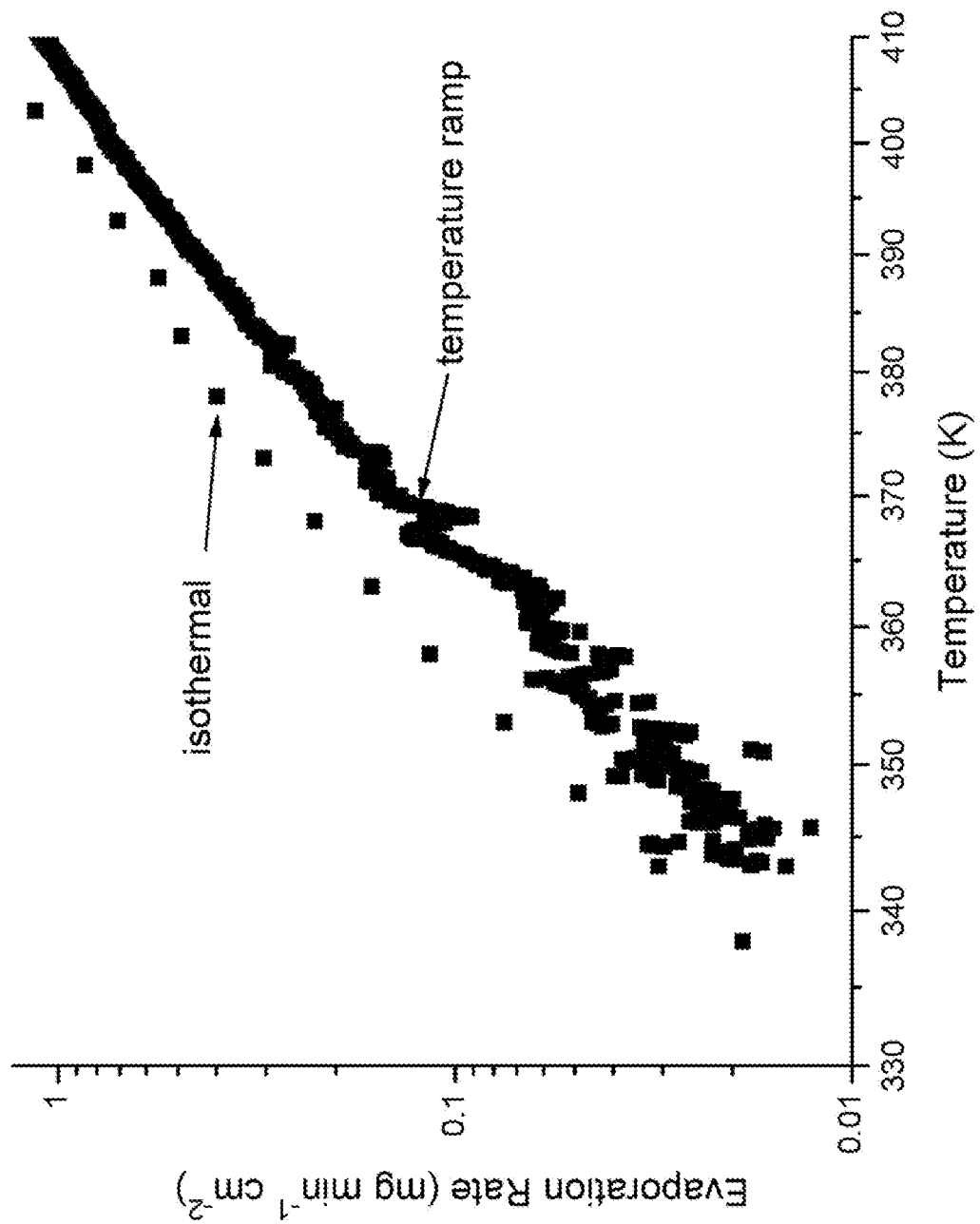
Fig. 10. Comparison of isothermal and temperature ramp data for bis(*N*,*N*'-diisopropylacetamidinato)cobalt(II)

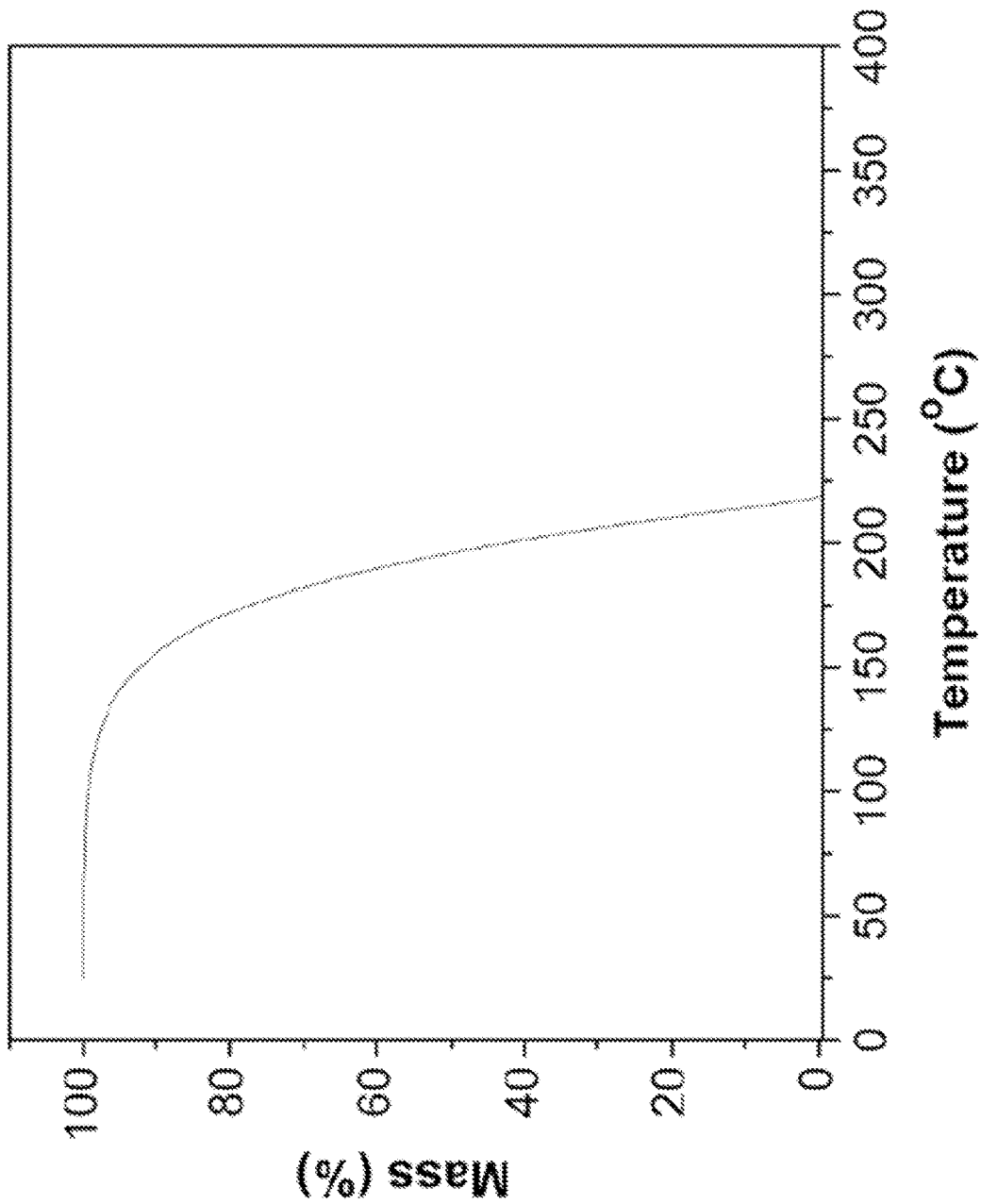
Fig. 11. Mass loss of bis(*N,N'*-diisopropylpentamidinato)manganese(II) as temperature is increased at 10 K min$^{-1}$

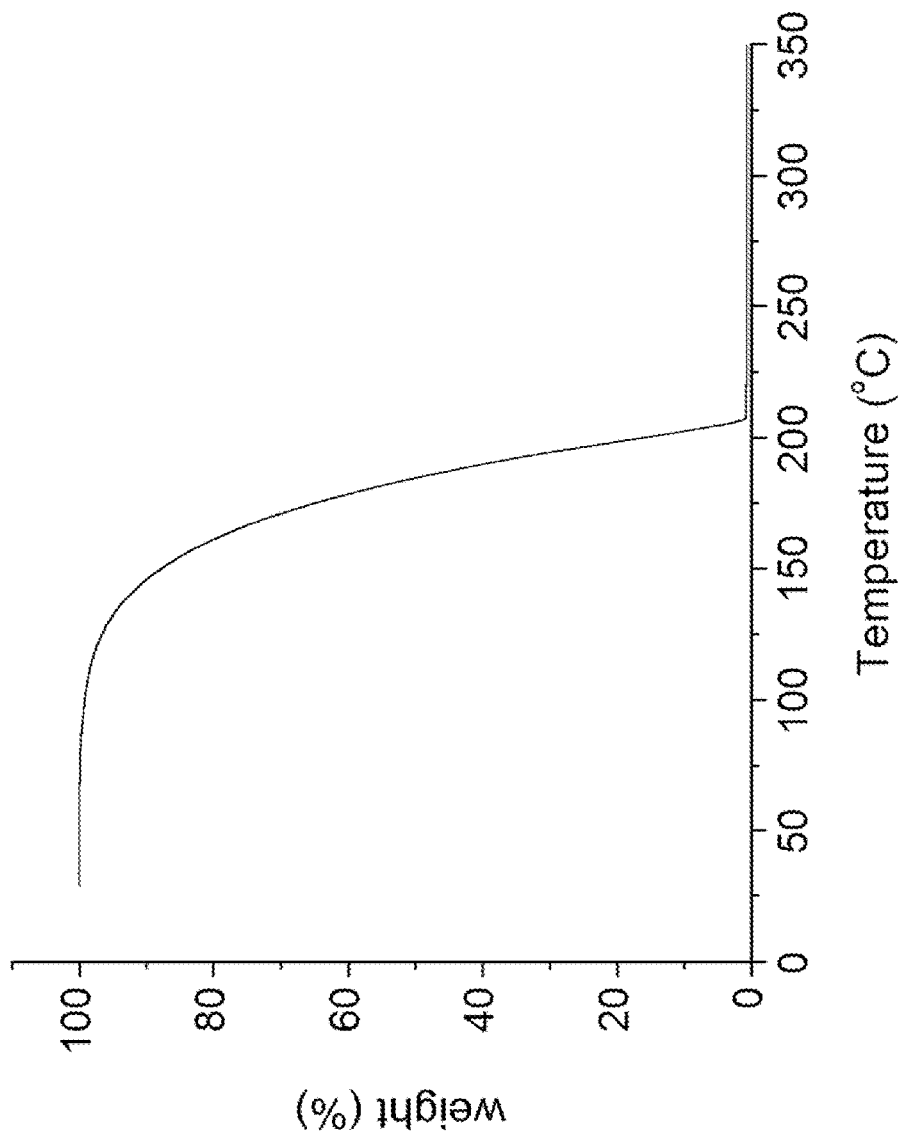
Fig. 12. Mass loss of bis(*N,N'*-di-*tert*-butylacetamidinato)nickel(II) as temperature is increased at 10 K min⁻¹

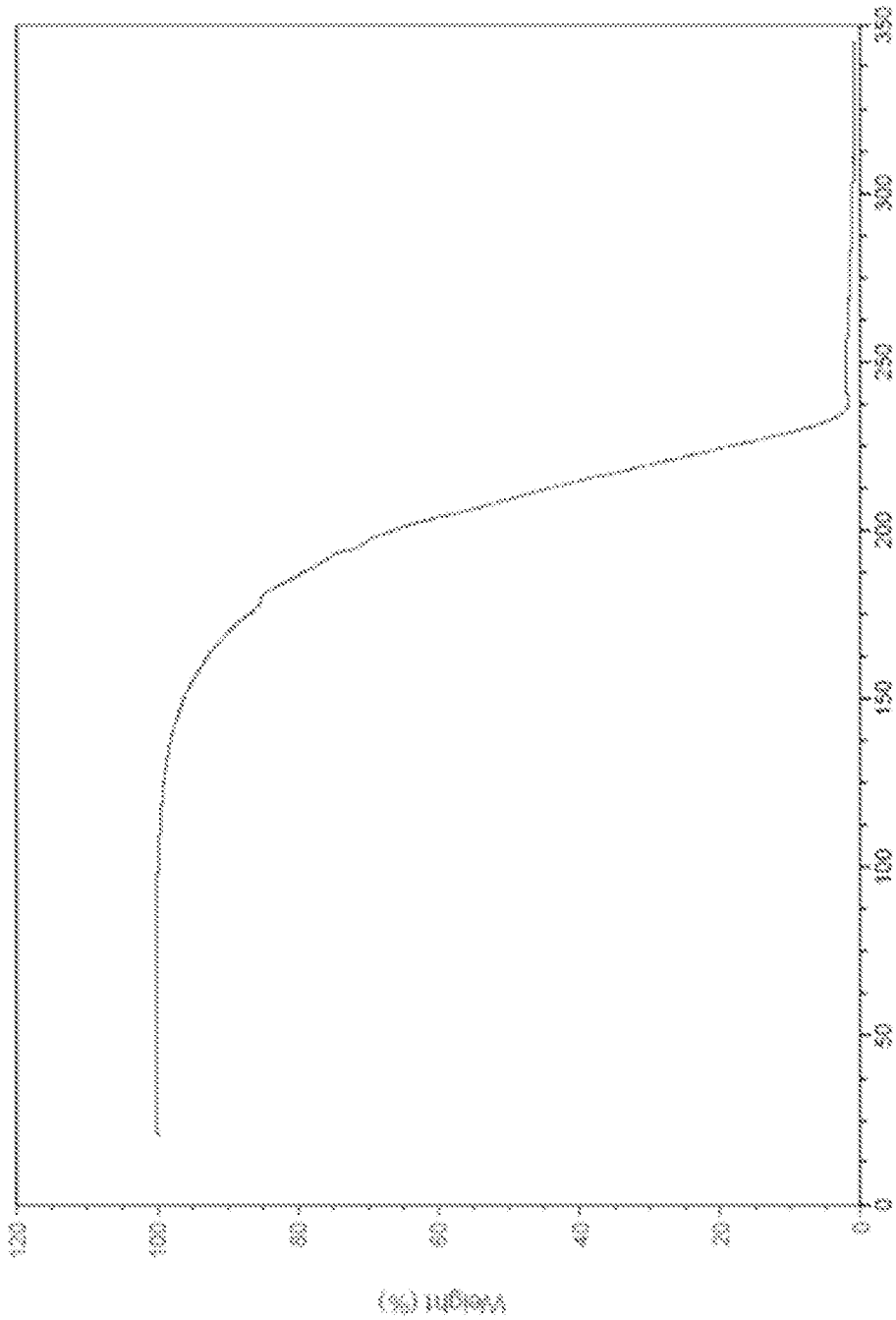
Fig. 13. Mass loss of tris(N,N'-diisopropylformamidinato)lanthanum as temperature is increased at 10 K min$^{-1}$

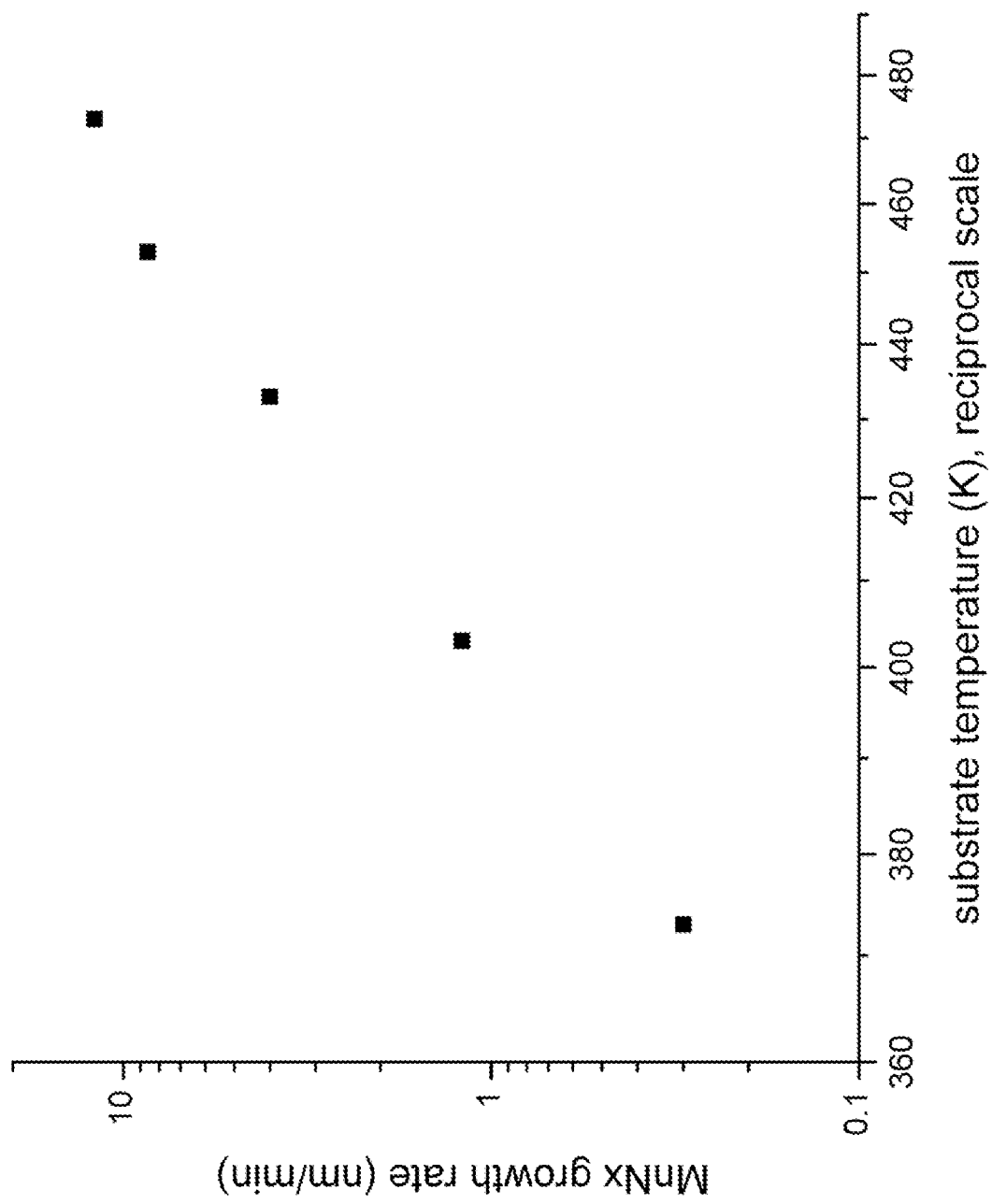
Fig. 14. Deposition rate of manganese nitride as a function of temperature

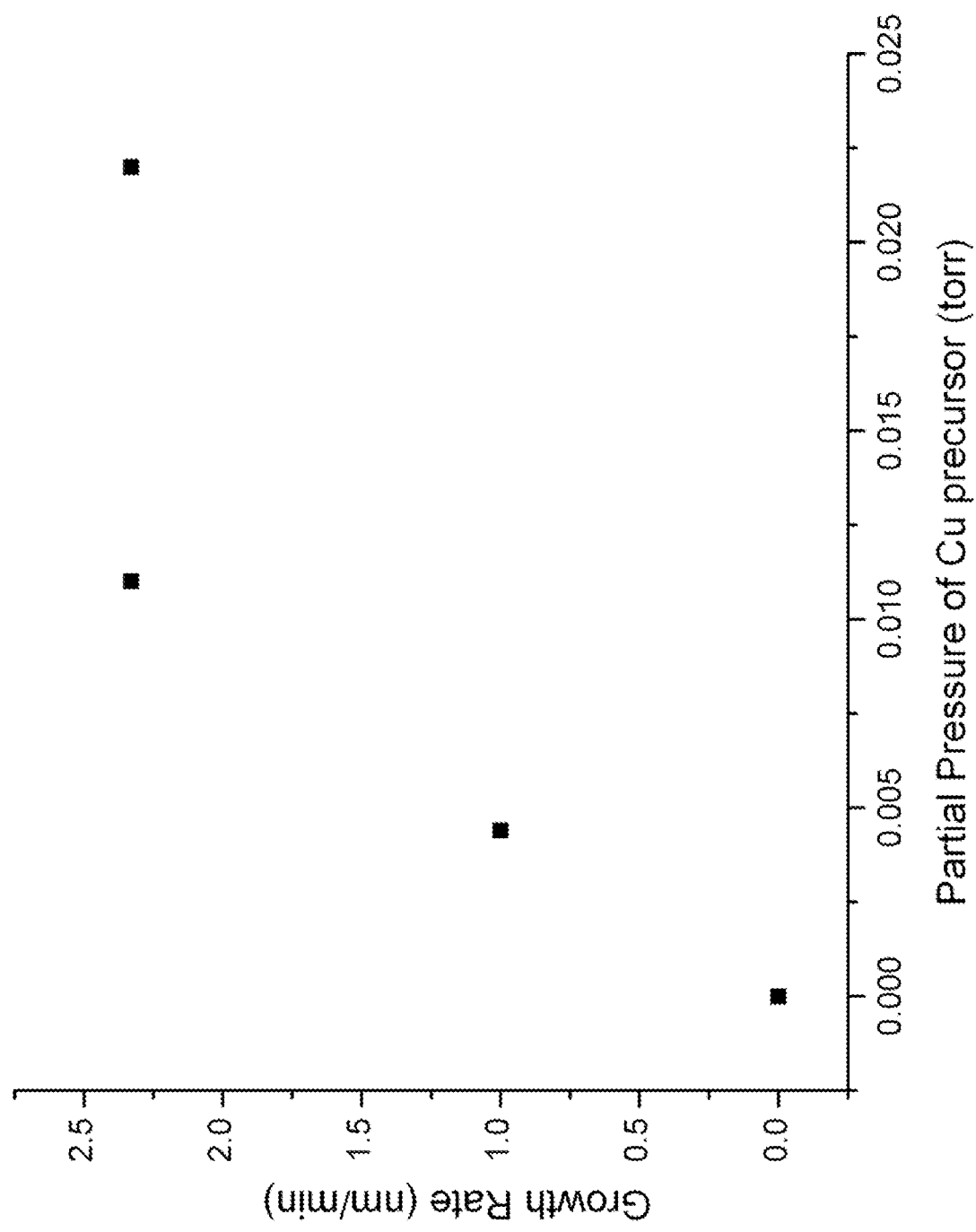
Fig. 15. Deposition rate of copper as a function of precursor pressure

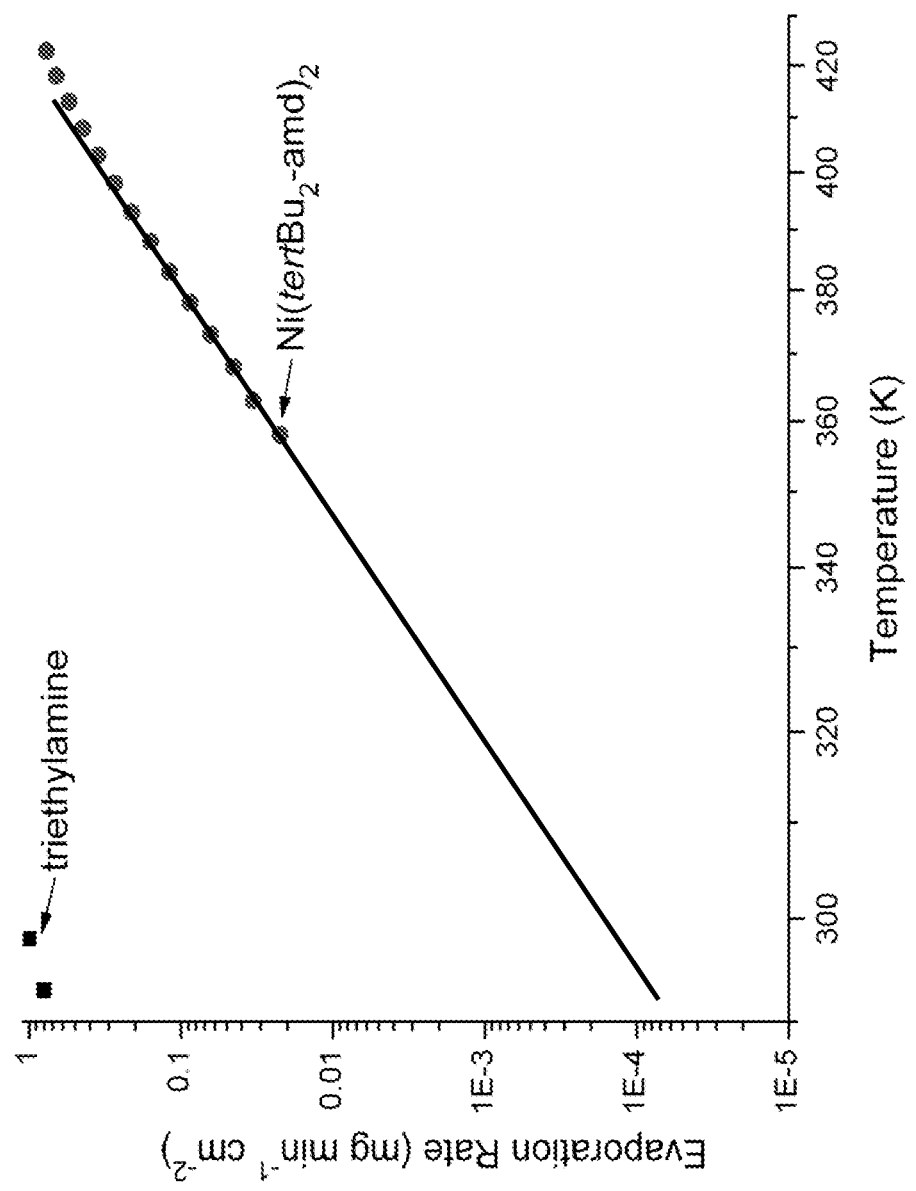
Fig. 16. Evaporation rates of triethylamine and Ni(tertBu$_2$-amd)$_2$

VAPOR SOURCE USING SOLUTIONS OF PRECURSORS IN TERTIARY AMINES

RELATED APPLICATIONS

This application is a U.S. National Stage application under 35 U.S.C. § 371 of International Patent Application No. PCT/US14/41310, filed Jun. 6, 2014, which claims priority to U.S. Patent Application Ser. No. 61/831,784, filed Jun. 6, 2013, the contents of which are hereby incorporated by reference herein in their entireties.

FIELD OF THE INVENTION

This disclosure relates to vapor deposition of materials, including chemical vapor deposition (CVD) and atomic layer deposition (ALD).

BACKGROUND

In CVD processes, vapors of one or more precursors are directed over a substrate on which material is deposited as a product of chemical reaction(s) of the precursor vapor(s). In one kind of CVD process, the vapor(s) are created in a region separated from the substrate. In another kind of CVD process, sometimes called spray pyrolysis, a precursor liquid or solution is broken into tiny droplets that evaporate to form a vapor close to the surface of a heated substrate.

In ALD processes, two or more precursor vapors are alternately directed onto a surface on which their reaction product is deposited.

In order to obtain reproducible results from CVD or ALD processes, it is important to provide a reproducible concentration of precursor vapor. Bubblers are commonly used to produce precursor vapor for these processes, but the amount of precursor vapor delivered from a bubbler can vary with time. The temperature of the bubbler has a large effect on the delivery rate of vapor, so small variations in bubbler temperature cause large variations in vapor delivery rate. The delivery rate should be determined by the equilibrium vapor pressure of the precursor, but often the actual delivery rate is lower than expected. When the carrier gas flow rate is too high, or the level in the bubbler is too low, the equilibrium vapor pressure cannot be attained. If a solution is used in a bubbler, the delivery rate will change with time unless the vapor pressures of precursor and solvent are matched closely or a constant-boiling composition is chosen. The equilibrium vapor pressures of precursors with low vapor pressure are difficult to measure reliably, so the actual delivery rate from a bubbler is hard to determine.

When a precursor is a solid material, a solvent is often used to dissolve the precursor. Then the solution of the precursor is used in one of these processes. It has been found in practice that it is very difficult to find solvents that meet all the requirements for successful deposition processes using their solutions.

SUMMARY

It has surprisingly been discovered that certain solvents comprising tertiary amines meet all the requirements for vapor deposition.

To be useful for vapor deposition, a solvent preferably meets many requirements. The solvent is preferably chosen so that its presence does not interfere with the deposition process. It is preferably chemically inert in the conditions of the deposition, or it may even contribute to the chemical process as a reagent. The solvent preferably does not contribute undesired impurities to the deposited material. For example, in depositing a pure metal, solvents containing oxygen should be avoided because oxygen may contaminate the metal film. Similarly, solvents containing halogens may deposit material with halogen impurities.

The solvent preferably should not etch or dissolve the film, because the films may become etched or pitted, or may even fail to form in the presence of such a solvent. The solvent also preferably should not corrode or etch the substrate or the deposition equipment. Similarly, any reaction byproducts or decomposition products preferably should also not be corrosive. Solvents containing halogens may particularly be prone to cause etching or corrosion.

Preferably, the solvent should also readily dissolve a high concentration of the precursor, so that unnecessarily large volumes of solution do not need to be processed.

The evaporation rates of the solvent and the precursor should also preferably be reasonably close to each other. If the solvent has a much higher evaporation rate than the precursor, then the solvent may evaporate prematurely, clogging the equipment with solid precursor. If the solvent has a much lower evaporation rate than the precursor, then solvent vapor may contaminate the deposited material or it may re-condense in places where it is not wanted in the equipment. To avoid these problems, the evaporation rates of the precursor and solvent should preferably be within an order of magnitude of each other at the temperature of evaporation.

If the solution and the metering system are held at room temperature, then the solvent should preferably not evaporate from the solution at room temperature as it is metered into an evaporation region held at a low pressure. Satisfactory continuous operation cannot be maintained if the solvent has a higher vapor pressure than the pressure in the evaporation region, because then a solid (at room temperature) precursor may tend to build up at the point where the pressure drops to the value in the evaporation region. Normally the evaporation region is held a pressure equal to or greater than the pressure in the deposition chamber. Thus the vapor pressure of the solvent at room temperature should preferably not exceed the pressure in the deposition chamber. For example, if a CVD chamber is held at a pressure of 10 Torr, then the vapor pressure of a solvent should preferably not exceed 10 Torr at room temperature. Clogging problems may occur even with a solvent with vapor pressure at room temperature less than the pressure in the evaporation region, because after part of the solvent evaporates, the solution may exceed the saturation concentration, so that precursor precipitates from solution. It has been found that such problems can be avoided if the vaporization rate of precursor and solvent are well matched and are low at the temperature (normally room temperature) of the control valve that sets the flow of the solution.

The solvent should also preferably have a viscosity low enough so that its solution can be metered and handled easily without excessive pressure drop while flowing through flow-controllers and tubing. Typically, solutions with viscosity less than about 10 centipoise are preferred.

The viscosity and surface tension of a solvent should preferably be low enough so that for evaporation methods requiring nebulization, small droplets can be formed easily and without requiring the use of excessive amounts of energy. Small droplets evaporate more quickly than large droplets, avoiding possible decomposition of the precursors during the evaporation process needed for CVD and ALD.

Small droplets aid in making more uniform coatings by the spray pyrolysis version of CVD.

To reduce the risk of accidental fires, the solvent and solutions should preferably not be highly flammable.

The solvent and its solutions should preferably not be subject to polymerization or decomposition reactions under normal conditions of use or storage.

The solvent and its solutions should preferably have a melting point low enough so that they do not freeze under conditions of shipping or storage. For example, the solvent and its solutions should have a melting point below −20° C., or more preferably below −30° C.

The solvent should preferably not be toxic to humans, animals or plants, nor should its disposal cause any deleterious effects on the environment. The solvent should also preferably be biodegradable.

An effective solvent should preferably be easy to purify so that it is free of reactive impurities, such as water and oxygen, which often react with precursors.

The solvent should preferably be commercially available in sufficiently large amounts and from multiple sources so that an ample supply is reliably available. The solvent should preferably be cleared for large-scale commercial use by appropriate regulatory authorities. Renewable, natural and local sources are preferred.

The cost of the solvent should preferably be low, and preferably be easy and inexpensive to recycle or dispose of the solvent after its use.

It has surprisingly been discovered that certain solvents comprising tertiary amines meet all or most of these many requirements.

In some embodiments, a tertiary amine solution of a precursor is vaporized and used as a source for a CVD process or an ALD process.

In other embodiments, a tertiary amine solution of a precursor is dispersed into droplets and used as a source for the spray pyrolysis variant of CVD.

In some embodiments, the tertiary amine comprises straight-chain alkyl groups, such as n-butyl groups, n-pentyl groups, n-hexyl groups, n-heptyl groups or n-octyl groups.

Tests described below show that tertiary amines do not interfere with many vapor deposition processes, particularly those that operate at a substrate temperature below 300° C., or more preferably at temperatures below 200° C. In other words, the tertiary amine vapors do not participate in the surface reactions of the precursors or otherwise interfere with their operation. Tertiary amines do not contain oxygen or halogens, which could contaminate deposited materials.

Tertiary amines have been found to be good solvents, which can dissolve large concentrations of precursors.

Tertiary amines can be purified of reactive contaminants, such as water, oxygen, secondary amines and primary amines, by distillation from sodium metal.

The preferred tertiary amines have viscosities below 8 centipoise, so they can flow easily through flow controllers and valves. Tertiary amine solutions have low enough viscosity and surface tension so that they may be broken into small droplets easily by conventional nebulization methods, including spray nozzles and ultrasonic nebulizers. Low viscosity and low surface tension also allow the solution to spread into a thin layer for rapid evaporation by vaporization methods that evaporate from thin liquid films of solutions.

The preferred tertiary amines and their solutions have melting points below −30° C., so they will not freeze during shipment, storage or use.

Most of the tertiary amine solutions have flash points high enough to be classified as combustible liquids, rather than more dangerous flammable liquids. This means that at ambient temperatures, their vapors cannot be ignited by an ignition source without additional heating. Handling and transporting combustible liquids poses less danger of accidental fire than is present with flammable liquids.

Amines are present in many organisms, such as fish, so they are generally not highly toxic, and can be bio-degraded by natural processes.

Tertiary amines are commercially available in large quantities from multiple suppliers and at low cost.

BRIEF DESCRIPTION OF THE DRAWINGS

FIG. 1 plots the evaporation rate of tri-n-hexylamine at 115° C.

FIG. 2 plots the evaporation rates of (N,N'-di-sec-butylacetamidinato)copper(I) dimer and trialkylamines as a function of temperature.

FIG. 3 plots the evaporation rates of bis(N,N'-diisopropylpentamidinato)manganese(II) and trialkylamines as a function of temperature.

FIG. 4 plots the evaporation rates of tris(N,N'-diisopropylformamidinato)lanthanum(III) and trialkylamines as a function of temperature.

FIG. 5 plots the evaporation rates of bis(N,N'-diisopropylacetamidinato)cobalt(II) and trialkylamines as a function of temperature.

FIG. 6 plots the evaporation rates of bis(N,N'-di-tert-butylacetamidinato)nickel(II) and trialkylamines as a function of temperature.

FIG. 7 plots the evaporation rates of bis(N,N'-di-tert-butylacetamidinato)ruthenium(II) dicarbonyl and trialkylamines as a function of temperature.

FIG. 8 plots the mass loss of tri-n-hexylamine as temperature is increased at 10 K min$^{-1}$.

FIG. 9 plots the mass loss of (N,N'-di-sec-butylacetamidinato)copper(I) dimer as temperature is increased at 10 K min$^{-1}$.

FIG. 10 compares the evaporation rate of bis(N,N'-diisopropylacetamidinato)cobalt(II) determined by isothermal and by temperature ramp thermogravimetric data.

FIG. 11 plots the mass loss of bis(N,N'-diisopropylpentamidinato)manganese(II) as temperature is increased at 10 K min$^{-1}$.

FIG. 12 plots the mass loss of bis(N,N'-di-tert-butylacetamidinato)nickel(II) as temperature is increased at 10 K min$^{-1}$.

FIG. 13 plots the mass loss of tris(N,N'-diisopropylformamidinato)lanthanum as temperature is increased at 10 K min$^{-1}$.

FIG. 14 plots the deposition rate of manganese nitride as a function of temperature.

FIG. 15 plots the deposition rate of copper as a function of precursor pressure.

FIG. 16 plots the evaporation rates of triethylamine and bis(N,N'-di-tert-butylacetamidinato)nickel(II).

DETAILED DESCRIPTION

Definitions

The term "saturated hydrocarbon group" is used in this disclosure to mean a group containing carbon and hydrogen with a molecular formula $C_nH_{2n+1}$, where n is a positive integer.

Solvents

In one or more embodiments, a trialkylamine is used as a solvent. It has formula $R^1R^2R^3N$, where $R^1$, $R^2$ and $R^3$ are saturated hydrocarbon groups. In certain embodiments, the solvent and the one or more precursor compound for vapor deposition have vaporization rates that differ by less than a factor of 50. In some embodiments, the solvent and the one or more precursor compound for vapor deposition have vaporization rates that differ by less than a factor of 10. In other embodiments, the vaporization rates differ by less than a factor of 5, and in some instances by less than a factor of 2.

In one or more embodiments, the trialkylamine tri-n-butylamine, $(CH_3(CH_2)_3)_3N$, is used as a solvent. It has structural formula 1,

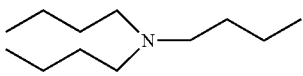

In one or more embodiments, the trialkylamine tri-n-pentylamine, $(CH_3(CH_2)_4)_3N$, is used as a solvent. It has structural formula 2,

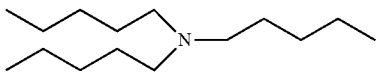

In one or more embodiments, the trialkylamine tri-n-hexylamine, $(CH_3(CH_2)_5)_3N$ is used as a solvent. It has structural formula 3,

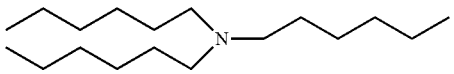

In one or more embodiments, the trialkylamine tri-n-heptylamine, $(CH_3(CH_2)_6)_3N$ is used as a solvent. It has structural formula 4,

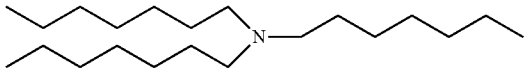

In some embodiments, the trialkylamine tri-n-octylamine, $(CH_3(CH_2)_7)_3N$ is used as a solvent. It has structural formula 5,

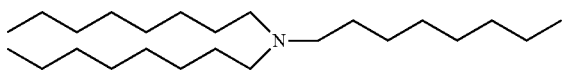

Solutions

Many types of metal or metalloid precursors may be dissolved in tertiary amines and their solutions then used in CVD or ALD. The metals include, but are not limited to, any of the transition metals, main-group metals and lanthanide metals. Transition metals of interest include Ti, V, Cr, Mn, Fe, Co, Ni, Cu, Zn, Y, Zr, Nb, Mo, Ru, Rh, Pd, Ag, Cd, Hf, Ta, W, Re, Os, Ir, Pt and Au. Main group metals of interest include Li, Na, K, Mg, Ca, Sr, Ba, Al, Ga, In, Sn, Pb, Sb and Bi. Lanthanide metals of interest include La, Ce, Pr, Nd, Sm, Eu, Gd, Tb, Dy, Ho, Er, Tm, Yb and Lu. Metalloids of interest include B, Si, Ge, As and Te. The metal precursor compounds may contain metals bonded to anionic ligands that form amidinates, β-diketonates, β-thioketonates, β-ketoiminates, β-diiminates, alkoxides, dialkylamides, alkyls, cycloalkyls, cycloalkenyls such as cyclopentadienyls, halides, and/or neutral ligands such as carbonyls, trialkylamines, pyridines, trialkylphosphines, ethers, thioethers, nitriles, isonitriles, as well as heteroleptic compounds containing two or more of these ligands.

Matching Solvents and Precursors

Reproducible and well-determined vapor delivery rates for CVD and ALD can be achieved by completely evaporating a controlled and measured flow of liquid or solution. One way to convert the liquid flow into a vapor flow is to break up the liquid into a spray of tiny droplets to facilitate its rapid evaporation from the high surface area of the droplets. However, very tiny particles remain un-evaporated from even the purest liquid droplets, and these particles can cause highly deleterious defects in the deposited films and the devices, such as computer chips, made from these films.

Formation of particles can be avoided by the use of direct liquid evaporation (DLE). In DLE, a measured steady flow of liquid is evaporated from its surface to produce a known flow rate of precursor vapor. The liquid flows smoothly along the bottom of a heated tube that supplies the heat needed for its vaporization. Preferably a carrier gas flows over the surface of the evaporating liquid, to help carry the vapors into the deposition region. Smooth, laminar flow conditions are maintained for both the liquid and gas streams, so that no liquid droplets are thrown into the gas phase to create residual particles. Any nonvolatile residue will gradually collect on the surface of the tube, eventually requiring the tubing to be cleaned or replaced. However, the residue will not be delivered along with the vapor, and the deposited films remain free of particle contamination.

The temperature of the tube must be sufficiently high to evaporate all of the liquid before it reaches the outlet of the tubing, where the vapor enters the deposition zone and coats the substrates. Accurate temperature control is not needed, because the temperature can be higher than the minimum required, and yet the same amount of vapor will be delivered by evaporating all of the liquid earlier in its flow path. This is true because the measurement and control of the liquid flow takes place at room temperature before the liquid enters the heated tube. Thus the reproducibility of a DLE source is much greater than a bubbler, which changes its delivery rate with small changes in its temperature.

DLE is a non-equilibrium evaporation process, because the vapor is swept away from the surface of the liquid before it can reach the equilibrium vapor pressure. The amount of liquid vaporized is thus determined by the evaporation rate. The rate of evaporation of a material can be measured using isothermal thermogravimetric analysis (TGA). In this method, a small sample (typically about 50 milligrams) of a material is held in the pan of a microbalance while a flow of a gas, such as nitrogen, passes over the surface of the material. As vapor leaves the surface of the material, its mass decreases and the microbalance measures the mass of the remaining un-evaporated material. FIG. 1 shows an example of mass loss rate measured by isothermal thermogravimetric analysis of tri-n-hexylamine evaporating at 115° C. into a flow of nitrogen gas at one atmosphere pressure. The furnace temperature was increased from 110° C. to 115° C. during the time from 160 minutes to 162 minutes, at which time the temperature had stabilized at 115° C. The many mass values measured from 162 minutes until 175 minutes form a nearly continuous thick line in FIG. 1. These points are then fit (in a least squares sense) to a straight line passing through the band of measurements and plotted as a line that can be seen projecting from 162 minutes to below 161 minutes and also from 175 minutes to above 176 minutes. The slope of this fitted line is −0.25030±0.00002 milligrams per minute. The area of the liquid surface in the pan is 0.723 square centimeters. Thus the evaporation rate of tri-n-hexylamine at 115° C. is 0.2503/0.723=0.346 mg min$^{-1}$ cm$^{-2}$. Similar analyses at a series of temperatures gave the evaporation rates plotted in FIG. 2. Because the flowing nitrogen constantly removes vapor from above the surface of the evaporating material, the evaporating vapor pressure never rises up to its equilibrium vapor pressure. Thus isothermal TGA measures the rate of evaporation without any significant correction for re-condensation.

One class of precursors widely used for ALD and CVD are metal amidinates. One example is (N,N'-di-sec-butylacetamidinato)copper(I) dimer, whose evaporation rate was also measured by the same isothermal TGA method. The resulting evaporation rates are plotted in FIG. 2 alongside the evaporation rates for tri-n-hexylamine (labeled as "trihexylamine") and tri-n-heptylamine (labeled as "triheptylamine"). There is a close match between the evaporation rates of N,N'-di-sec-butylacetamidinato)copper(I) dimer (labeled as "Cu(sec-Bu$_2$-amd)") and tri-n-heptylamine, which differ by at most a factor of 2. Thus they will evaporate together in a DLE system. FIG. 2 also shows that the evaporation rates of tri-n-hexylamine and (N,N'-di-sec-butylacetamidinato)copper(I) dimer differ from each other by factors that vary between 5 and 10 at different temperatures. These evaporation rates are still close enough to each other so that both (N,N'-di-sec-butylacetamidinato)copper(I) dimer and tri-n-hexylamine will evaporate together at steady state in a DLE system fed with a solution of (N,N'-di-sec-butylacetamidinato)copper(I) dimer in tri-n-hexylamine. Because of the limited solubility of the precursors, there will generally be more mass of solvent than precursor in the solution. Thus for them to evaporate together, it can be preferable to have the vaporization rate of the solvent to be a little higher than that of the precursor. That is the case for (N,N'-di-sec-butylacetamidinato)copper(I) dimer in tri-n-hexylamine.

In some embodiments of this invention, the evaporation rate of the precursor and that of a useful solvent differ by less than a factor of 50. In some embodiments, the evaporation rate of the precursor and that of a useful solvent differ by less than a factor of 10. In some embodiments, the evaporation rates differ by a factor less than 5. In some embodiments, the evaporation rates differ by a factor between 1.5 to 50. In other embodiments, the evaporation rates differ by a factor between 1.5 to 10. In yet other embodiments, the evaporation rates differ by a factor between 1.5 to 5. In steady state operation, any of these combinations will produce a uniform flow of precursor vapor, along with the vapor of the solvent. Only at the beginning and end of a run will a DLE system produce variable ratios of the vapors. At the beginning of a run, the component with a higher evaporation rate will be more concentrated in the vapor, compared to the less volatile component. At the end of the run, after the solution flow is turned off, the vapor flow of the component with the lower evaporation rate will become elevated relative to that of the less volatile component, which has already mostly evaporated from the solution. These initial and final transients are smaller if the evaporation rates of precursor and solvent are more closely matched.

EXAMPLE 1

To see how these data on evaporation rate can be used to estimate the required size of a DLE system, suppose that a CVD process is needed to coat a 300 millimeter diameter wafer (area 0.0707 square meters) with copper at a rate of 16 nanometers per minute. This deposition rate has been found to be achievable by iodine-catalyzed reduction of (N,N'-di-sec-butylacetamidinato)copper(I) dimer with hydrogen gas. The question to be answered is the following one. How large a surface area is needed to vaporize the required flow of precursor? Taking the density of the copper film as 8.96×10$^3$ kilograms per cubic meter, the mass of copper deposited per minute is area×thickness×density=0.0707 m$^2$×16×10$^{-9}$ m×8.96×10$^3$ kg m$^{-3}$=1.0×10$^{-5}$ kg min$^{-1}$ Thus a flow containing at least 10 milligrams per minute of copper metal is needed. The fractional copper content of (N,N'-di-sec-butylacetamidinato)copper(I) dimer is 2×molecular mass of copper/molecular mass of precursor=2×63.546/465.67=0.273

Thus the minimum flow of precursor is 10 mg min$^{-1}$/0.273=37 mg min$^{-1}$. At 160° C.=433 K, FIG. 2 shows that the evaporation rate of this copper precursor is about 0.8 mg cm$^{-2}$ min$^{-1}$. The area of liquid surface required is thus precursor flow rate/evaporation rate per unit area=37 mg min$^{-1}$/0.8 mg cm$^{-2}$ min$^{-1}$=46 cm$^2$ If the liquid spreads to a width of 1 centimeter over the bottom of the tubing in which it is flowing, then a 46 centimeter length of tubing is needed to evaporate the liquid.

This calculation is based on evaporation of the neat precursor into 1 atmosphere (760 Torr) of nitrogen gas. If the evaporation is done at a lower pressure, such as 10 Torr of nitrogen, then the evaporation rate will be larger, and the area needed is correspondingly smaller. On the other hand, this calculation also assumed that all the copper in the precursor is deposited (100% yield) on the surface of a wafer. In a real system, the yield is lower than 100%, and the corresponding area needed for evaporation is larger because a higher flow rate of precursor is needed. The surface of the liquid is partly precursor and partly solvent, depending on the concentration. For example, for a 30 weight percent solution of bis(N,N'-di-sec-butylacetamidinato)copper(I) dimer in tri-n-heptylamine, the surface is about ⅓ precursor and ⅔ solvent. Thus the evaporation rate of the precursor may be reduced by a factor of about 3 from the value for this precursor by isothermal TG. This dilution effect of the solvent will increase the area needed for evaporation by a factor of about 3.

Routine experimentation can establish the required evaporation conditions for any particular system. For example, by using a transparent vaporization region, such as a long glass tube, one can observe how far the solution flows along the tube before it evaporates. The conditions, such as temperature and flow rates, can then be optimized to make sure that the solution is fully vaporized before it reaches the end of the tube. The estimate for evaporation area given in Example 1 provides a reasonable starting point for such optimization.

Evaporation rate data for a copper precursor, (N,N'-di-sec-butylacetamidinato)copper(I) dimer, shown in FIG. 2, is a close match, within a factor of 2, to the vaporization rate of tri-n-heptylamine, so the components of this solution will evaporate together. The evaporation rate of tri-n-hexylamine is about 6 times higher at the upper end of the measured temperature range, and within 9 times higher over the whole temperature range. Thus tri-n-hexylamine is also a suitable solvent for DLE of (N,N'-di-sec-butylacetamidinato)copper (I) dimer.

Evaporation rate data for a manganese precursor, bis(N, N'-diisopropylpentamidinato)manganese(II), shown in FIG. 3, is a close match, within a factor of 1.8, to the vaporization rate of tri-n-heptylamine, so the components of this solution will evaporate together. The evaporation rate of tri-n-hexylamine is about 5 times higher at the upper end of the measured temperature range, and within 7 times higher over the whole temperature range. Thus tri-n-hexylamine is also a suitable solvent for DLE of bis(N,N'-diisopropylpentamidinato)manganese(II).

Evaporation rate data for a lanthanum precursor, tris(N, N'-diisopropylformamidinato)lanthanum(III), shown in FIG. 4, is a close match, within a factor of 1.5, to the vaporization rate of tri-n-heptylamine, so the components of this solution will evaporate together. The evaporation rate of tri-n-hexylamine is about 3 times higher at the upper end of the measured temperature range, and within 5 times higher over the whole temperature range. Thus tri-n-hexylamine is also a suitable solvent for DLE of tris(N,N'-diisopropylformamidinato)lanthanum(III).

The evaporation rate of a cobalt precursor, bis(N,N'-diisopropylacetamidinato)cobalt(II), shown in FIG. 5, is about 2 times larger than that of tri-n-hexylamine. Thus tri-n-hexylamine is a suitable solvent for DLE of bis(N,N'-diisopropylacetamidinato)cobalt(II).

Isothermal evaporation rate data in for bis(N,N'-di-tert-butylacetamidinato)nickel(II) precursor, shown in FIG. 6, shows that tri-n-hexylamine evaporates about twice as fast, and thus is a solvent suitable for DLE of this precursor. Tri-n-heptylamine evaporates about 3 times more slowly that this nickel precursor, which is also close enough to function effectively in a DLE system.

Isothermal evaporation rate data for bis(N,N'-di-tert-butylacetamidinato)ruthenium(II) dicarbonyl, shown in FIG. 7, shows that tri-n-hexylamine evaporates 50 to 100 times faster than this precursor. Thus the less volatile solvent tri-n-heptylamine is a more suitable solvent for DLE of bis(N,N'-di-tert-butylacetamidinato)ruthenium(II) dicarbonyl, because its evaporation rate ranges from 3 times to 10 times higher than that of the bis(N,N'-di-tert-butylacetamidinato)ruthenium(II) dicarbonyl. Bis(N,N'-di-tert-butylacetamidinato)ruthenium(II) tricarbonyl is more soluble than bis(N,N'-di-tert-butylacetamidinato)ruthenium(II) dicarbonyl, but the third carbonyl may dissociate before or during evaporation, so the evaporation rate of bis(N,N-'-di-tert-butylacetamidinato)ruthenium(II) dicarbonyl may be relevant to bis(N,N'-di-tert-butylacetamidinato)ruthenium(II) tricarbonyl as well.

It should be noted that within the temperature ranges tested in FIG. 4 for tris(N,N'-diisopropylformamidinato) lanthanum(III) and in FIG. 7 for bis(N,N'-di-tert-butylacetamidinato)ruthenium(II) dicarbonyl, these precursors are solid, so that their actual surface areas are not well-determined by the area of the sample cup. Thus the actual evaporation rate for a solid may differ from the apparent value based on the area of the sample cup. In contrast, all of the other precursors tested are liquid at least in the higher end of the temperature ranges tested, so that their surface area is well-determined by the area of the cup in which they are contained.

Collecting isothermal TGA data for a wide range of temperatures takes a long time. A quicker, but less accurate, kind of TGA is done by measuring the mass loss while increasing the temperature at a constant rate. The remaining mass of the sample is recorded as a function of temperature to provide these temperature-ramp TGA data. Temperature-ramp TGA data for tri-n-hexylamine are plotted in FIG. 8 and for (N,N'-di-sec-butylacetamidinato)copper dimer in FIG. 9. The slopes of these temperature-ramp TGA curves, multiplied by the temperature ramp rate (10 K min$^{-1}$ for all the data shown here) and by the sample size (typically about 10 milligrams) provide data that are roughly equivalent to the isothermal TGA data shown in FIG. 2. In these TGA data taken with constantly rising temperature, the actual temperature of the sample lags a little behind that of the thermocouple, so experimental errors are larger that of data taken under isothermal conditions. Also, isothermal data have smaller random errors because they have many data points from which the time derivative may be extracted, whereas only a few data points contribute to the derivative extracted from TGA data taken during a temperature ramp. Isothermal and temperature-ramp data are compared in FIG. 10 for bis(N,N'-diisopropylacetamidinato)cobalt(II). The temperature-ramp data are noisier in the low temperature range below 390 K, and they are systematically below the isothermal data by 5 to 10 degrees. Nevertheless, TGA data from a temperature ramp can be used to compare the rates of evaporation with sufficient reliability to guide the choice of solvents for DLE.

Temperature-ramp TGA data are shown for bis(N,N'-diisopropylpentamidinato)manganese(II) in FIG. 11, for bis (N,N'-di-tert-butylacetamidinato)nickel(II) in FIG. 12, and for tris(N,N'-diisopropylformamidinato)lanthanum in FIG. 13. The differences between temperature-ramp TGA data for these precursors and those of tri-n-hexylamine are all small enough so that they also evaporate together in a DLE process.

During a DLE process, the vapor pressure of a precursor does not reach its equilibrium value, because the molecules are being carried away from the surface by the flow of carrier gas. Thus the rate or molecules re-condensing is small compared to the rate of evaporation. At equilibrium, the number of molecules condensing from its vapor per unit time and per unit area (called the condensation flux, F) is given by kinetic theory as $$F = s\, P(2\,\pi\, m\, k_B T)^{-1/2}$$

where s is the sticking coefficient, P is the equilibrium vapor pressure, m is the molecular mass, $k_B$ is Boltzmann's constant and T is the temperature in K. At equilibrium, the same flux of molecules is evaporating from the surface, so this same expression for F represents the evaporation rate if no molecules are re-condensing on the surface. Thus the evaporation rate of a precursor scales linearly with its equilibrium vapor pressure. For most materials, however, the sticking coefficient s is completely unknown. Thus measurements of equilibrium vapor pressure cannot be used to predict evaporation rates.

Another important criterion for solvents is that they dissolve a sufficient amount of precursor. Useful concentrations of the solutions are typically larger than 10 weight per cent, larger than 20 weight percent in more preferred embodiments, and larger than 40 weight percent in the most preferred embodiments. The following examples 2 through 10, show that trialkylamines dissolve useful amounts of amidinate precursors.

EXAMPLE 2

Solution of a Nickel Amidinate in Tri-n-hexylamine

The purity of commercially available tri-n-hexylamine is 95% and GC-MS analysis showed the existence of water and di-n-hexylamine impurities, which can react with precursors. Purification to remove oxygen, moisture and di-n-hexylamine was carried out as follows: 95 g of tri-n-hexylamine was mixed with 1 g of Na and heated to 100° C. under a $N_2$ atmosphere for 3 hours. Then the purified tri-n-hexylamine was distilled out and stored in a glove box under a purified $N_2$ atmosphere. A nickel precursor, bis(N, N'-di-tert-butylacetamidinato)nickel(II),

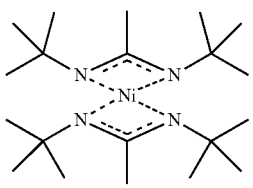

was dissolved in the purified dry, oxygen-free tri-n-hexylamine. Its solubility is 22 weight percent.

EXAMPLE 3

Solution of a Manganese Amidinate in Tri-n-hexylamine

The manganese precursor, bis(N,N'-di-tert-butylacetamidinato)manganese(II),

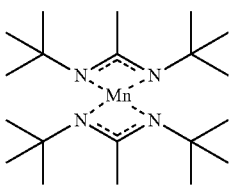

was dissolved in dry, oxygen-free tri-n-hexylamine. Its solubility is 42 weight percent.

EXAMPLE 4

The manganese precursor, bis(N,N'-diisopropylpentamidinato)manganese(II),

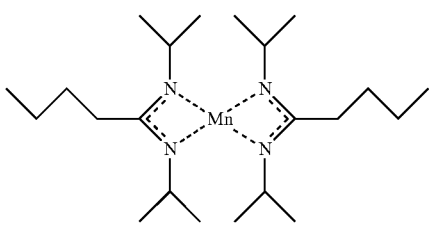

was dissolved in dry, oxygen-free tri-n-hexylamine. Its solubility is 8 weight percent.

EXAMPLE 5

Solution of a Cobalt Amidinate in Tri-n-hexylamine

A cobalt amidinate precursor, bis(N,N'-diisopropylacetamidinato)cobalt(II),

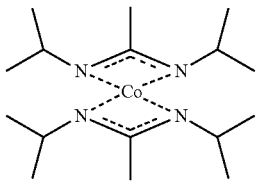

is dissolved in dry, oxygen-free tri-n-hexylamine. Its solubility is high.

EXAMPLE 6

Solution of a Copper Amidinate in Tri-n-alkylamines

A copper amidinate precursor, bis(N,N'-di-sec-butylacetamidinato)copper(I) dimer,

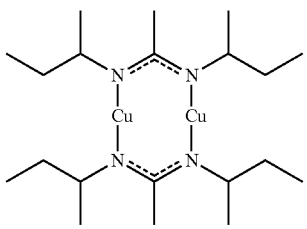

was dissolved in dry, oxygen-free tri-n-hexylamine and in tri-n-heptylamine. Its solubility is about 30 weight percent.

EXAMPLE 7

Solution of a Yttrium Amidinate in Tri-n-alkylamines

A yttrium precursor, tris(N,N'-diisopropylacetamidinato)yttrium(III),

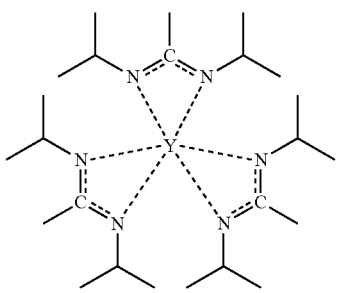

is dissolved in tri-n-hexylamine and in tri-n-heptylamine. Its solubility is high.

EXAMPLE 8

Solution of a Lanthanum Amidinate in Tri-n-alkylamines

A lanthanum precursor, tris(N,N'-diisopropylformamidinato)lanthanum(III),

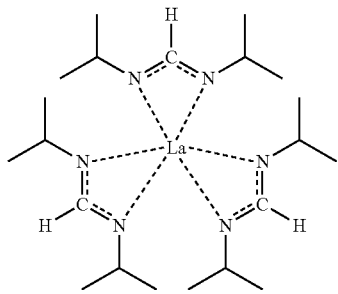

is dissolved in tri-n-hexylamine and in tri-n-heptylamine. Its solubility is high.

EXAMPLE 9

Solution of a Tin Amidinate in Tri-n-hexylamine

A tin(II) amidinate precursor, bis(N,N'-diisopropylacetamidinato)tin(II),

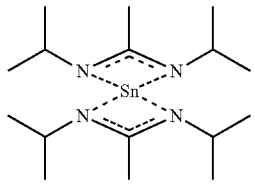

is dissolved in tri-n-hexylamine. Its solubility is high.

EXAMPLE 10

Solution of a Ruthenium Amidinate in Tri-n-alkylamines

A ruthenium amidinate precursor, bis(N,N'-di-tert-butylacetamidinato)ruthenium(II)tricarbonyl,

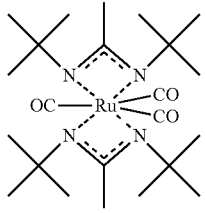

is dissolved in tri-n-hexylamine and in tri-n-heptylamine. Its solubility is moderate.

As one use of these solutions in CVD or ALD processes, they may be nebulized into a mist of small droplets. Conventional nebulization or spray equipment may be used. For example, U.S. Pat. No. 6,180,190 describes an ultrasonic nebulizer suitable for use with these solutions. Commercial systems for vaporization of solutions are sold by Brooks Instrument Company, MKS Instruments, Horiba, Kemstrean and other companies.

In preferred embodiments, the solution may be vaporized for use in CVD or ALD without nebulization, by flowing the solution as a thin film down a heated tube along with a carrier gas to assist carrying away the vapors from the surface. An advantage this method is that it avoids the generation of particles often produced by nebulization methods. This DLE method is illustrated in the following examples.

EXAMPLE 11

CVD of Manganese Nitride Using a Solution in Tri-n-hexylamine

A solution was prepared as in Example 4 and flowed at a rate of 0.2 g min$^{-1}$ through a Coriolis mass flow controller (Brooks Instrument). This liquid flow joined at a tee with a 100 sccm flow of pure nitrogen gas into a ¼ inch diameter stainless steel tube 1 meter long heated to 150° C. The tube inclined downward at an angle of a few degrees so that the liquid solution flowed in a smooth laminar stream along the bottom of the tube until it evaporated into the nitrogen gas flowing above it in the tube. A homogeneous gas mixture of manganese amidinate vapor, tri-n-hexylamine vapor and nitrogen gas flowed out of the outlet end of the tube. This gas mixture mixed in another tee with a 60 sccm flow of an equimolar mixture of ammonia gas and hydrogen gas. This combined gas mixture was passed into a cylindrical deposition chamber with 3.5 cm inner diameter held at a temperature of 160° C. and a total pressure of 5 Torr. Substrates of silicon and glass resting on a half-cylinder in the deposition chamber were coated with manganese nitride. Similar experiments using different substrate temperatures gave the growth rates plotted as a function of reciprocal absolute temperature in FIG. 14.

EXAMPLE 12

CVD of Copper Using a Solution in Tri-n-hexylamine

A solution prepared as in Example 6. The precursor solution was kept at room temperature in a stainless steel syringe sealed by 2 O-rings. The flow of the precursor solution was controlled by a syringe pump (KD Scientific model 210) at a flow rate of 0.1 cm$^3$/min. The precursor solution was mixed with 100 sccm of nitrogen carrier gas at room temperature in a tee. These flows went together down into a coil of stainless steel tubing (1.8 meters long, ¼ inch outside diameter) heated in an oven. An oven temperature of 120° C. was found to be too low to completely evaporate the liquid, while 160° C. was sufficiently high to evaporate all the liquid at the flow-rate used. Before the solution reached the end of the heated tubing it was vaporized and mixed with the nitrogen carrier gas. The vapor mixture exiting from this tubing was then mixed at a tee with 100 sccm of hydrogen just before entering a cylindrical deposition chamber held at a temperature of 200° C. and a pressure of 5 Torr. Substrates of silicon and glass resting on a half-cylinder in the deposition chamber were coated with electrically conductive copper films. Silicon substrates with holes 50 micrometers deep and 1 micrometer wide were coated with highly conformal polycrystalline films of copper.

The growth rates of copper were measured after several similar experiments using different flow rates for the copper precursor solution. The resulting growth rates were plotted in FIG. 15. After rising linearly at small flow rates, the growth rate became constant for partial pressures of copper amidinate above 0.01 Torr. The conditions in which the growth rate becomes constant at high partial pressures enable the growth of the surprisingly conformal copper films. As the copper precursor vapor diffuses down a small hole and its vapor concentration decreases by reacting to form the growing film, the growth rate remains constant so long as the remaining vapor pressure remains above the threshold of 0.01 Torr.

EXAMPLE 13

CVD of Nickel Nitride Using a Solution in Tri-n-hexylamine

A solution prepared as in Example 2 is kept at room temperature in a stainless steel syringe sealed by 2 O-rings. The flow of the precursor solution is controlled by a syringe pump (KD Scientific model 210) at a flow rate of 0.1 cm$^3$/min. The solution flows along with a 60 sccm flow of pure nitrogen gas into a ¼ inch diameter stainless steel tube 1 meter long heated to 150° C. The tube is inclined downward at an angle of a few degrees so that the liquid solution flows in a smooth laminar stream along the bottom of the tube until it evaporates into the nitrogen gas flowing above it in the tube. A homogeneous gas mixture of nickel amidinate vapor, tri-n-hexylamine vapor and nitrogen gas flows out of the outlet end of the tube. This gas mixture is mixed in a tee with a 60 sccm flow of ammonia gas and a 60 sccm flow of hydrogen gas. This gas mixture is passed into a cylindrical deposition chamber with 3.5 cm inner diameter held at a temperature of 160° C. and a total pressure of 5 Torr. Substrates of silicon and glass resting on a half-cylinder in the deposition chamber are coated with nickel nitride.

Other trialkylamine solvents may have different alkyl groups attached to the same nitrogen atom, as for example in N-octadecyl-N,N-dimethylamine.

COMPARATIVE EXAMPLE 1

CVD of Copper Using a Solution in Dodecane 25 g of bis(N,N'-di-sec-butylacetamidinato)copper(I) dimer was dissolved in 100 mL of n-dodecane ($C_{12}H_{26}$) to make a solution with a concentration of 0.72 molal or 0.43 molar and a density of 0.79 g/mL, measured at 21° C. This solution was treated as in Example 12. Copper was deposited on substrates heated to 180° C. Dodecane has a disadvantage that its melting point is around −10° C., so that the solution can become frozen during storage or shipping. Another disadvantage is that its vapor pressure at room temperature is around 120 mTorr, so that when it mixes with oil in a vacuum pump, the pump is not able to reach a low base pressure below 120 mTorr.

COMPARATIVE EXAMPLE 2

CVD of Copper Using a Solution in Farnesene Isomers

Comparative Example 1 is repeated with a mixture of farnesene isomers as the solvent in place of dodecane. The melting point of this solution is below −60° C., so it cannot become frozen during shipping or handling. Thus it overcomes the disadvantage of the relatively high melting point of the dodecane solution of Comparative Example 1. However, farnesene has a disadvantage in that it can polymerize, and thus its long-term stability during storage cannot be guaranteed.

COMPARATIVE EXAMPLE 3

CVD of Copper Using a Solution in 1-methylnaphthalene

Comparative Example 1 is repeated with 1-methylnaphthalene in place of dodecane. The melting point of this solution is below −20° C., so it is unlikely to become frozen during shipping or handling. Thus it overcomes the disadvantage of the relatively high melting point of the dodecane solution of Comparative Example 1. 1-methylnaphthalene is not subject to polymerization, so it overcomes that problem of farnesene in Comparative Example 2. However, 1-methylnaphthalene has the disadvantage of toxicity. It is highly toxic to marine organisms, and repeated human exposure causes sensitization and is likely to lead to other health problems because it has been reported in vitro to cause damage to chromosomes.

COMPARATIVE EXAMPLE 4

Evaporation Rates of Triethylamine and Nickel Amidinate Compared

Isothermal thermogravimetric analysis was carried out for triethylamine. Because the evaporation rate of triethylamine was found to be extremely high even at room temperature, only a couple of temperatures near room temperature could be measured. At higher temperatures, the rate-limiting step is heat transfer from nitrogen gas to the evaporating liquid, rather than the evaporation process. Measurements at temperatures below room temperature would slow down the evaporation to a measurable range, but available thermogravimetric equipment only has a furnace for heating, but no provision for cooling below room temperature. FIG. 16 compares the evaporation rate of triethylamine with that of nickel bis(N,N'-di-tert-butylacetamidinate). The evaporation rate of the nickel precursor is too slow to be measured at temperatures as low as room temperature. Nevertheless, the values measured at higher temperatures can be extrapolated down to room temperature. It is clear from the results in FIG. 16 that triethylamine evaporates about $10^4$ times faster than the nickel precursor, so that triethylamine is not a satisfactory solvent for DLE of this material.

An additional problem with triethylamine as a solvent for DLE is that it evaporates so quickly at room temperature that solid precursor accumulates in the valve that controls the flow rate of the solution. Soon the flow of solution stops because the solid precursor plugs up the control valve. This problem does not occur with the solvents of this invention because their evaporation rates are low at room temperature, because they match the low evaporation rates of the precursors at room temperature.

The preferred trialkylamine solvents of this invention overcome all these disadvantages of the solvents examined in Comparative Examples 1 through 4.

It is recognized, of course, that those skilled in the art may make various modifications and additions to the processes and solutions of this disclosure without departing from the spirit and scope of the present contribution to the art. Accordingly, it is to be understood that the protection sought to be afforded hereby should be deemed to extend to the subject matter of the claims and all equivalents thereof fairly within the scope of this disclosure.

I claim:

1. A solution comprising:
    a solvent comprising one or more tertiary amines selected from the group consisting of tri-n-butylamine, tri-n-pentylamine, tri-n-hexylamine, tri-n-heptylamine, and tri-n-octylamine; and
    one or more compounds comprising at least one metal bonded to at least two amidinate ligands dissolved in said solvent;
    wherein the solvent and the one or more compounds differ in vaporization rate by a factor between 1.5 to 50 at 340-460 K.

2. The solution of claim 1, wherein the solvent and the one or more compounds differ in vaporization rate by a factor between 1.5 to 10.

3. The solution of claim 1, wherein the solvent and the one or more compounds differ in vaporization rate by a factor between 1.5 to 5.

4. The solution of claim 1, wherein the one or more tertiary amine comprises tri-n-butylamine.

5. The solution of claim 1, wherein the one or more tertiary amine comprises tri-n-pentylamine.

6. The solution of claim 1, wherein the one or more tertiary amine comprises tri-n-hexylamine.

7. The solution of claim 1, wherein the one or more tertiary amine comprises tri-n-heptylamine.

8. The solution of claim 1, wherein the one or more tertiary amine comprises tri-n-octylamine.

9. The solution of claim 1, in which the one or more compounds comprises bis(N,N'-di-tert-butylacetamidinato)nickel(II) and the one or more tertiary amine comprises tri-n-hexylamine.

10. The solution of claim 1, in which the one or more compounds comprises bis(N,N'-diisopropylpentamidinato)manganese(II) and the one or more tertiary amine comprises tri-n-hexylamine or tri-n-heptylamine.

11. The solution of claim 1, in which the one or more compounds comprises (N,N'-di-sec-butylacetamidinato)copper(I) dimer and the one or more tertiary amine comprises tri-n-hexylamine or tri-n-heptylamine.

12. The solution of claim 1, in which the one or more compounds comprises bis(N,N'-diisopropylacetamidinato)cobalt(II) and the one or more tertiary amine comprises tri-n-hexylamine.

13. A solution comprising:
    a solvent comprising one or more tertiary amines selected from the group consisting of tri-n-butylamine, tri-n-pentylamine, tri-n-hexylamine, tri-n-heptylamine, and tri-n-octylamine; and
    one or more compounds dissolved in said solvent and selected from the group consisting of bis(N,N'-di-tert-butylacetamidinato)nickel(II), bis(N,N'-di-tent-butylacetamidinato)manganese(II), bis(N,N'-diisopropylpentamidinato)manganese(II), bis(N,N'-diisopropylacetamidinato)cobalt(II), bis(N,N'-di-sec-butylacetamidinato)copper(I), tris(N,N'-diisopropylacetamidinato)yttrium(III), tris(N,N'-diisopropylformamidinato)lanthanum(III), bis(N,N'-diisopropylacetamidinato)tin(II), bis(N,N'-di-tert-butylacetamidinato)ruthenium(II)tricarbonyl, and bis(N,N'-di-tert-butylacetamidinato)ruthenium(II) dicarbonyl;
    wherein the solvent and the one or more compounds differ in vaporization rate by a factor between 1.5 to 50 at 340-460 K.

14. The solution of claim 13, wherein the one or more amines are tri-n-hexylamine and tri-n-heptylamine and the one or more compounds are selected from the group consisting of bis(N,N'-di-sec-butylacetamidinato)copper(I), bis(N,N'-diisopropylpentamidinato)manganese(II), tris(N,N'-diisopropylformamidinato)lanthanum(III), bis(N,N'-diisopropylacetamidinato)cobalt(II), bis(N,N'-di-tent-butylacetamidinato)nickel(II), and bis(N,N'-di-tert-butylacetamidinato)ruthenium(II)dicarbonyl.

15. A process of chemical vapor deposition wherein the solution of claim 1 is vaporized.

16. A process of atomic layer deposition wherein the solution of claim 1 is vaporized.

* * * * *